United States Patent
Cheng et al.

(10) Patent No.: US 8,605,669 B2
(45) Date of Patent: Dec. 10, 2013

(54) SYSTEM AND METHOD FOR SIGNALING CONTROL INFORMATION IN A MOBILE COMMUNICATION NETWORK

(75) Inventors: Jung-Fu Cheng, Fremont, CA (US); Daniel Larsson, Solna (SE); Dirk Gerstenberger, Stockholm (SE); Robert Baldemair, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 291 days.

(21) Appl. No.: 13/101,752

(22) Filed: May 5, 2011

(65) Prior Publication Data

US 2011/0274062 A1 Nov. 10, 2011

Related U.S. Application Data

(60) Provisional application No. 61/331,898, filed on May 6, 2010, provisional application No. 61/355,369, filed on Jun. 16, 2010.

(51) Int. Cl.
*H04W 4/00* (2009.01)
(52) U.S. Cl.
USPC ......................................... 370/329
(58) Field of Classification Search
USPC ........................ 370/329, 310, 335, 342, 349
See application file for complete search history.

(56) References Cited

U.S. PATENT DOCUMENTS

| | | | |
|---|---|---|---|
| 7,852,743 B2* | 12/2010 | Kwon et al. | 370/203 |
| 2004/0257250 A1* | 12/2004 | Sebire | 341/81 |
| 2009/0027242 A1* | 1/2009 | Cideciyan et al. | 341/95 |
| 2009/0245284 A1* | 10/2009 | Xu et al. | 370/474 |
| 2012/0093197 A1* | 4/2012 | Kim et al. | 375/135 |

OTHER PUBLICATIONS

Ericsson et al: "Evaluation of PUCCH Proposals for Carrier Aggregation." R1-102612, $3^{rd}$ Generation Partnership Project (3GPP), Mobile Competence Centre. XP050419831. May 4, 2010.

* cited by examiner

*Primary Examiner* — Andrew Lai
*Assistant Examiner* — Zhiren Qin

(57) ABSTRACT

A method of wirelessly transmitting control information includes generating control information comprising a plurality of control bits and encoding the control bits using a block code that outputs an encoded bit sequence comprising encoded bits b(0), b(1), . . . , b(19). The control bits are encoded using the block code by generating a linear combination of a plurality of basis sequences. The method also includes dividing the encoded bits into a first group and a second group. The first group includes the encoded bits {b(0), b(1), b(5), b(6), b(8), b(11), b(12), b(14), b(17), b(19)} and the second group includes the encoded bits {b(2), b(3), b(4), b(7), b(9), b(10), b(13), b(15), b(16), b(18)}. Additionally, the method includes transmitting the first group of encoded bits on a first set of carriers and transmitting the second group of encoded bits on a second set of carriers. The second set of carriers have different frequencies from the first set of carriers.

8 Claims, 25 Drawing Sheets

Basis sequences for LTE (20, A) block code

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 0 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 1 | 0 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 0 | 0 | 1 | 0 | 1 | 1 | 1 |
| 12 | 1 | 0 | 0 | 1 | 0 | 1 | 1 | 1 | 0 | 1 | 1 | 1 | 1 |
| 13 | 1 | 1 | 0 | 1 | 0 | 1 | 0 | 1 | 1 | 1 | 1 | 1 | 1 |
| 14 | 1 | 0 | 0 | 0 | 1 | 1 | 0 | 1 | 0 | 0 | 1 | 1 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

*FIG. 2*

Reduced set of basis sequences for LTE (20, A) block code (M_{i15} omitted)

| i | $M_{i,0}$ | $M_{i,1}$ | $M_{i,2}$ | $M_{i,3}$ | $M_{i,4}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|
| 0  | 1 | 1 | 0 | 0 | 0 | 0 | 0 | 0 | 0 | 1 | 1 | 0 |
| 1  | 1 | 1 | 1 | 0 | 0 | 0 | 0 | 0 | 1 | 1 | 1 | 0 |
| 2  | 1 | 0 | 0 | 1 | 0 | 1 | 0 | 1 | 1 | 1 | 1 | 1 |
| 3  | 1 | 0 | 1 | 1 | 0 | 0 | 0 | 1 | 0 | 1 | 1 | 1 |
| 4  | 1 | 1 | 1 | 1 | 0 | 0 | 1 | 0 | 0 | 1 | 1 | 1 |
| 5  | 1 | 1 | 0 | 0 | 1 | 1 | 1 | 1 | 0 | 1 | 1 | 1 |
| 6  | 1 | 0 | 1 | 0 | 1 | 1 | 0 | 1 | 1 | 1 | 1 | 1 |
| 7  | 1 | 0 | 0 | 1 | 1 | 0 | 1 | 1 | 0 | 1 | 1 | 1 |
| 8  | 1 | 1 | 0 | 1 | 1 | 1 | 1 | 0 | 0 | 1 | 1 | 1 |
| 9  | 1 | 0 | 1 | 1 | 1 | 1 | 0 | 0 | 1 | 1 | 1 | 1 |
| 10 | 1 | 0 | 1 | 0 | 0 | 1 | 1 | 0 | 1 | 1 | 1 | 1 |
| 11 | 1 | 1 | 1 | 0 | 0 | 1 | 0 | 1 | 0 | 1 | 1 | 1 |
| 12 | 1 | 0 | 0 | 1 | 0 | 0 | 1 | 1 | 1 | 1 | 1 | 1 |
| 13 | 1 | 1 | 0 | 1 | 0 | 1 | 1 | 0 | 1 | 1 | 1 | 1 |
| 14 | 1 | 0 | 0 | 0 | 1 | 0 | 1 | 0 | 0 | 1 | 0 | 1 |
| 15 | 1 | 1 | 0 | 0 | 1 | 1 | 1 | 0 | 1 | 0 | 0 | 1 |
| 16 | 1 | 0 | 1 | 1 | 1 | 1 | 0 | 0 | 0 | 0 | 1 | 1 |
| 17 | 1 | 1 | 0 | 1 | 1 | 0 | 0 | 1 | 0 | 0 | 1 | 0 |
| 18 | 1 | 0 | 0 | 0 | 0 | 1 | 0 | 0 | 0 | 0 | 0 | 0 |
| 19 | 1 | 0 | 0 | 1 | 1 | 0 | 0 | 0 | 0 | 0 | 0 | 0 |

*FIG. 3*

Minimum slot Hamming distance profile for LTE (20, A) encoding without interleaving

| # OF INFO BITS A | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 5 | 3 | 1 |
| 4 | 3 | 5 | 1 |
| | 5 | 3 | 2 |
| 5 | 3 | 5 | 2 |
| | 5 | 3 | 2 |
| 6 | 0 | 10 | 1 |
| | 10 | 0 | 1 |
| 7 | 0 | 10 | 1 |
| | 10 | 0 | 1 |
| 8 | 0 | 10 | 1 |
| | 10 | 0 | 1 |
| 9 | 0 | 10 | 1 |
| | 10 | 0 | 1 |
| 10 | 0 | 10 | 1 |
| | 10 | 0 | 1 |
| 11 | 0 | 4 | 1 |
| | 4 | 0 | 1 |
| 12 | 0 | 4 | 3 |
| | 4 | 0 | 1 |
| 13 | 0 | 4 | 3 |
| | 4 | 0 | 3 |

*FIG. 4A*

Minimum slot Hamming distance profile for
LTE (20, A) encoding using Interleaver A

| # OF INFO BITS A | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 4 | 4 | 1 |
| 4 | 6 | 2 | 1 |
| 5 | 1 | 9 | 1 |
| | 9 | 1 | 1 |
| 6 | 1 | 9 | 1 |
| | 9 | 1 | 1 |
| 7 | 1 | 5 | 1 |
| | 5 | 1 | 1 |
| 8 | 1 | 5 | 2 |
| | 5 | 1 | 2 |
| 9 | 1 | 5 | 4 |
| | 5 | 1 | 3 |
| 10 | 1 | 5 | 8 |
| | 5 | 1 | 8 |
| 11 | 6 | 0 | 1 |
| 12 | 0 | 4 | 1 |
| | 4 | 0 | 1 |
| 13 | 0 | 4 | 3 |
| | 4 | 0 | 2 |

*FIG. 4B*

Minimum slot Hamming distance profile for
LTE (20, A) encoding using Interleaver B

| # OF INFO BITS A | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 3 | 7 | 1 |
| | 7 | 3 | 1 |
| 4 | 3 | 5 | 1 |
| 5 | 3 | 5 | 1 |
| | 5 | 3 | 1 |
| 6 | 7 | 1 | 1 |
| 7 | 5 | 1 | 1 |
| 8 | 1 | 5 | 1 |
| | 5 | 1 | 2 |
| 9 | 1 | 5 | 2 |
| | 5 | 1 | 3 |
| 10 | 6 | 0 | 1 |
| 11 | 4 | 0 | 2 |
| 12 | 0 | 4 | 1 |
| | 4 | 0 | 3 |
| 13 | 0 | 4 | 3 |
| | 4 | 0 | 3 |

*FIG. 4C*

Comparison of interleaving options for LTE (20, A) encoding

| A | RANGE IN 1301 CANDIDATES | FORMAT 2 NO INTERLEAVER | FORMAT 2 INTERLEAVER A | FORMAT 2 INTERLEAVER B | FORMAT 2 OPTIMAL BIT SWAPPING I | FORMAT 2 OPTIMAL BIT SWAPPING II |
|---|---|---|---|---|---|---|
| 2 | 5 | 5 | 5 | 5 | 5 | 5 |
| 3 | 3-4 | 3 | 4 | 3 | 4 | 4 |
| 4 | 3 | 3 | 2 | 3 | 3 | 3 |
| 5 | 3 | 3 | 1 | 3 | 3 | 3 |
| 6 | 1-3 | 0 | 1 | 1 | 2 | 3 |
| 7 | 1-2 | 0 | 1 | 1 | 2 | 1 |
| 8 | 1-2 | 0 | 1 | 1 | 1 | 1 |
| 9 | 1 | 0 | 1 | 0 | 1 | 1 |
| 10 | 1 | 0 | 1 | 0 | 1 | 1 |

FIG. 5

Minimum slot Hamming distance profile for
LTE (20, A) encoding using Interleaver C

| # OF INFO BITS A | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 4 | 4 | 1 |
| 4 | 5 | 3 | 1 |
| 5 | 5 | 3 | 2 |
| 6 | 2 | 6 | 1 |
| 6 | 6 | 2 | 1 |
| 7 | 2 | 4 | 3 |
| 7 | 4 | 2 | 1 |
| 8 | 2 | 4 | 6 |
| 8 | 4 | 2 | 4 |
| 9 | 1 | 5 | 2 |
| 9 | 5 | 1 | 4 |
| 10 | 1 | 5 | 8 |
| 10 | 5 | 1 | 8 |
| 11 | 6 | 0 | 1 |
| 12 | 0 | 4 | 1 |
| 13 | 0 | 4 | 2 |
| 13 | 4 | 0 | 1 |

*FIG. 6A*

Alternative basis sequences for implementing Bit Assignment I

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 1 | 1 | 0 | 0 | 0 | 0 | 0 | 0 | 1 | 1 | 1 | 0 |
| 2  | 1 | 0 | 0 | 1 | 0 | 0 | 1 | 0 | 1 | 1 | 1 | 1 | 1 |
| 3  | 1 | 0 | 1 | 1 | 0 | 0 | 0 | 1 | 1 | 0 | 1 | 1 | 1 |
| 4  | 1 | 1 | 1 | 0 | 1 | 0 | 0 | 0 | 0 | 0 | 1 | 1 | 1 |
| 5  | 1 | 0 | 1 | 1 | 0 | 1 | 0 | 1 | 0 | 0 | 1 | 1 | 1 |
| 6  | 1 | 0 | 0 | 0 | 0 | 0 | 1 | 1 | 0 | 1 | 0 | 0 | 1 |
| 7  | 1 | 1 | 0 | 1 | 0 | 0 | 1 | 1 | 1 | 0 | 1 | 1 | 1 |
| 8  | 1 | 0 | 1 | 0 | 1 | 0 | 1 | 1 | 0 | 1 | 1 | 1 | 1 |
| 9  | 1 | 1 | 1 | 1 | 0 | 1 | 1 | 1 | 1 | 0 | 1 | 0 | 0 |
| 10 | 1 | 0 | 0 | 0 | 0 | 1 | 0 | 1 | 1 | 1 | 1 | 1 | 1 |
| 11 | 1 | 1 | 0 | 1 | 1 | 1 | 0 | 1 | 0 | 1 | 1 | 1 | 1 |
| 12 | 1 | 0 | 1 | 0 | 0 | 1 | 1 | 0 | 0 | 1 | 1 | 1 | 1 |
| 13 | 1 | 0 | 0 | 0 | 0 | 1 | 1 | 1 | 1 | 1 | 1 | 0 | 1 |
| 14 | 1 | 1 | 1 | 0 | 1 | 1 | 0 | 0 | 1 | 0 | 0 | 0 | 1 |
| 15 | 1 | 1 | 0 | 0 | 1 | 1 | 1 | 0 | 0 | 1 | 0 | 0 | 1 |
| 16 | 1 | 0 | 0 | 0 | 1 | 1 | 0 | 0 | 1 | 1 | 0 | 1 | 1 |
| 17 | 1 | 0 | 1 | 0 | 1 | 1 | 1 | 0 | 0 | 1 | 1 | 1 | 1 |
| 18 | 1 | 1 | 0 | 0 | 0 | 0 | 0 | 1 | 0 | 0 | 0 | 1 | 1 |
| 19 | 1 | 1 | 1 | 1 | 1 | 1 | 1 | 0 | 0 | 0 | 0 | 0 | 0 |

*FIG. 6B*

Minimum slot Hamming distance profile for
LTE (20, $A$) encoding using Interleaver D

| # OF INFO BITS $A$ | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 4 | 4 | 1 |
| 4 | 3 | 5 | 1 |
| 5 | 3 | 5 | 2 |
| 6 | 3 | 5 | 3 |
| 6 | 5 | 3 | 3 |
| 7 | 1 | 5 | 1 |
| 8 | 1 | 5 | 2 |
| 8 | 5 | 1 | 1 |
| 9 | 1 | 5 | 4 |
| 9 | 5 | 1 | 3 |
| 10 | 1 | 5 | 8 |
| 10 | 5 | 1 | 6 |
| 11 | 0 | 6 | 1 |
| 11 | 6 | 0 | 1 |
| 12 | 0 | 4 | 1 |
| 12 | 4 | 0 | 2 |
| 13 | 0 | 4 | 3 |
| 13 | 4 | 0 | 5 |

*FIG. 7A*

Alternative basis sequences for implementing Bit Assignment II

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 0 | 0 | 1 | 0 | 0 | 1 | 0 | 1 | 1 | 1 | 1 | 1 |
| 2  | 1 | 1 | 1 | 1 | 1 | 0 | 0 | 0 | 0 | 0 | 1 | 1 | 1 |
| 3  | 1 | 0 | 0 | 0 | 1 | 0 | 0 | 1 | 1 | 1 | 1 | 1 | 1 |
| 4  | 1 | 0 | 1 | 1 | 1 | 0 | 0 | 0 | 0 | 1 | 1 | 1 | 1 |
| 5  | 1 | 1 | 0 | 0 | 0 | 1 | 1 | 0 | 0 | 0 | 1 | 1 | 1 |
| 6  | 1 | 0 | 0 | 1 | 1 | 0 | 0 | 0 | 1 | 0 | 1 | 1 | 1 |
| 7  | 1 | 1 | 0 | 0 | 0 | 0 | 0 | 1 | 0 | 0 | 1 | 1 | 1 |
| 8  | 1 | 0 | 1 | 0 | 1 | 0 | 1 | 0 | 1 | 0 | 1 | 0 | 0 |
| 9  | 1 | 1 | 0 | 1 | 0 | 0 | 1 | 0 | 0 | 1 | 0 | 1 | 0 |
| 10 | 1 | 0 | 0 | 1 | 0 | 1 | 0 | 1 | 0 | 0 | 1 | 1 | 1 |
| 11 | 1 | 1 | 0 | 0 | 0 | 1 | 0 | 0 | 1 | 0 | 1 | 1 | 1 |
| 12 | 1 | 0 | 0 | 0 | 1 | 1 | 0 | 1 | 0 | 1 | 1 | 1 | 1 |
| 13 | 1 | 0 | 0 | 0 | 0 | 1 | 0 | 1 | 0 | 0 | 1 | 1 | 1 |
| 14 | 1 | 1 | 0 | 0 | 1 | 1 | 1 | 1 | 0 | 0 | 1 | 1 | 1 |
| 15 | 1 | 0 | 1 | 0 | 1 | 1 | 0 | 1 | 0 | 1 | 1 | 1 | 1 |
| 16 | 1 | 1 | 0 | 0 | 1 | 1 | 0 | 1 | 1 | 0 | 1 | 0 | 1 |
| 17 | 1 | 1 | 0 | 0 | 1 | 1 | 1 | 0 | 0 | 1 | 1 | 0 | 1 |
| 18 | 1 | 1 | 1 | 0 | 1 | 1 | 1 | 1 | 0 | 0 | 0 | 1 | 1 |
| 19 | 1 | 0 | 0 | 0 | 0 | 1 | 1 | 0 | 0 | 0 | 0 | 0 | 0 |

*FIG. 7B*

Minimum slot Hamming distance profile for LTE (20, $A$) encoding without $M_{i5}$

| # OF INFO BITS $A$ | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 5 | 3 | 1 |
| 4 | 3 | 5 | 1 |
| 4 | 5 | 3 | 2 |
| 5 | 3 | 5 | 2 |
| 5 | 5 | 3 | 2 |
| 6 | 4 | 2 | 2 |
| 7 | 2 | 4 | 1 |
| 7 | 4 | 2 | 4 |
| 8 | 5 | 1 | 2 |
| 9 | 1 | 5 | 4 |
| 9 | 5 | 1 | 4 |
| 10 | 0 | 4 | 1 |
| 11 | 0 | 4 | 3 |
| 12 | 0 | 4 | 3 |

*FIG. 8*

Comparison of interleaving options for
LTE (20, $A$) encoding without $M_{i5}$

| $A$ | RANGE IN 94 CANDIDATES | $M_{i,5}$ REMOVED NO INTERLEAVER | $M_{i,5}$ REMOVED + INTERLEAVER E |
|---|---|---|---|
| 2 | 5 | 5 | 5 |
| 3 | 3-4 | 3 | 3 |
| 4 | 3 | 3 | 3 |
| 5 | 3 | 3 | 3 |
| 6 | 2 | 2 | 2 |
| 7 | 2 | 2 | 2 |
| 8 | 1-2 | 1 | 2 |
| 9 | 1 | 1 | 1 |
| 10 | 1 | 0 | 1 |

*FIG. 9*

**Minimum slot Hamming distance profile for LTE (20, *A*) encoding without $M_{i5}$ using Interleaver E**

| # OF INFO BITS *A* | MINIMUM SLOT HAMMING DISTANCE | | # OF SUCH CODEWORDS |
|---|---|---|---|
| | $d_{min,0}$ | $d_{min,1}$ | |
| 2 | 5 | 5 | 2 |
| 3 | 3 | 5 | 1 |
| 4 | 3 | 5 | 1 |
| 5 | 3 | 5 | 2 |
| 6 | 4 | 2 | 1 |
| 7 | 4 | 2 | 5 |
| 8 | 2 | 4 | 4 |
| 8 | 4 | 2 | 7 |
| 9 | 1 | 5 | 3 |
| 9 | 5 | 1 | 1 |
| 10 | 1 | 3 | 1 |
| 10 | 3 | 1 | 2 |
| 11 | 6 | 0 | 1 |
| 12 | 0 | 4 | 1 |
| 12 | 4 | 0 | 1 |

*FIG. 10A*

Alternative basis sequences for implementing Reduced-Set Bit Assignment

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| 0 | 1 | 1 | 0 | 0 | 0 | 0 | 0 | 0 | 1 | 1 | 1 | 0 |
| 1 | 1 | 1 | 1 | 0 | 0 | 0 | 0 | 0 | 0 | 1 | 1 | 0 |
| 2 | 1 | 1 | 0 | 0 | 1 | 1 | 0 | 1 | 0 | 1 | 1 | 1 |
| 3 | 1 | 0 | 0 | 1 | 1 | 0 | 1 | 1 | 0 | 1 | 1 | 1 |
| 4 | 1 | 1 | 0 | 0 | 0 | 1 | 0 | 0 | 0 | 1 | 1 | 1 |
| 5 | 1 | 0 | 1 | 1 | 1 | 1 | 1 | 1 | 0 | 1 | 1 | 1 |
| 6 | 1 | 0 | 1 | 0 | 0 | 0 | 1 | 0 | 1 | 1 | 0 | 1 |
| 7 | 1 | 0 | 0 | 1 | 0 | 0 | 0 | 1 | 0 | 0 | 1 | 0 |
| 8 | 1 | 0 | 0 | 0 | 0 | 1 | 0 | 0 | 0 | 1 | 1 | 1 |
| 9 | 1 | 0 | 0 | 1 | 0 | 0 | 1 | 0 | 1 | 0 | 1 | 0 |
| 10 | 1 | 1 | 1 | 1 | 1 | 1 | 1 | 0 | 1 | 1 | 1 | 1 |
| 11 | 1 | 0 | 0 | 0 | 0 | 1 | 0 | 1 | 0 | 1 | 1 | 1 |
| 12 | 1 | 0 | 1 | 1 | 0 | 0 | 0 | 0 | 0 | 1 | 1 | 1 |
| 13 | 1 | 1 | 0 | 0 | 1 | 1 | 1 | 0 | 1 | 1 | 0 | 1 |
| 14 | 1 | 1 | 1 | 1 | 0 | 1 | 0 | 0 | 0 | 1 | 1 | 1 |
| 15 | 1 | 1 | 0 | 0 | 0 | 1 | 1 | 0 | 0 | 1 | 1 | 1 |
| 16 | 1 | 1 | 0 | 0 | 1 | 1 | 1 | 0 | 0 | 1 | 0 | 1 |
| 17 | 1 | 1 | 1 | 0 | 1 | 1 | 0 | 0 | 1 | 1 | 1 | 1 |
| 18 | 1 | 1 | 1 | 0 | 0 | 1 | 1 | 0 | 0 | 0 | 1 | 1 |
| 19 | 1 | 1 | 0 | 1 | 1 | 1 | 1 | 0 | 0 | 0 | 0 | 0 |

*FIG. 10B*

SYSTEM AND METHOD FOR SIGNALING CONTROL INFORMATION IN A MOBILE COMMUNICATION NETWORK

PRIORITY CLAIM UNDER 35 U.S.C. 119(E)

This application claims the benefit of U.S. Provisional Application No. 61/331,898, filed May 6, 2010, entitled "Optimal Selective Bit-Swapping Methods and Apparatus for HARQ Feedback Coding," and U.S. Provisional Application No. 61/355,369, filed Jun. 16, 2010, entitled "Selective Bit-Swapping and Encoding Methods for HARQ Feedback Coding Systems," both of which are incorporated by reference herein in their entirety.

TECHNICAL FIELD OF THE INVENTION

This disclosure relates in general to wireless communication and, more particularly, to managing the transmission power of a mobile terminal.

BACKGROUND OF THE INVENTION

Modern wireless communication networks face an ever increasing demand for high-bandwidth communication services under a wide variety of radio conditions. Various factors may hinder communication over non-ideal radio channels. For instance, frequency-selective fading can attenuate signals transmitted over the frequencies targeted by the fading. This attenuation may result in the information transmitted over the relevant frequencies not being received or being misinterpreted by the intended receiver. For example, information in an encoded message transmitted over the relevant frequencies may become corrupted and the message may be incorrectly decoded at the receiver.

To counter fading and other frequency-selective effects, some communication technologies utilize frequency-diversity transmission schemes when transmitting critical information, such as certain types of control information. Under a typical frequency-diversity scheme, information is transmitted over multiple different frequencies. Frequency-selective effects targeting one of the transmission frequencies may have no impact on the other transmission frequencies. Consequently, frequency diversity schemes may introduce an overall frequency-diversity "gain" in a transmission of information when compared to a transmission of the information over the same channel using only a single frequency. However, the benefits resulting from a particular frequency-diversity scheme will be tied to how well the scheme distributes the informational content of the transmission between the multiple frequencies. If only a small portion of the informational content in the transmission is transmitted over the multiple frequencies, the frequency-diversity gain achieved by the scheme may be minimal.

Many communication technologies require that transmitters apply various forms of channel coding to transmitted information to improve a transmission's resistance to noise and other channel impairments. This channel encoding maps a bit sequence for transmission onto a longer codeword that includes some informational redundancy, thereby increasing the likelihood that the receiver will correctly determine the original bit sequence. While channel coding may increase the chances that a receiver will properly identify the transmitted information, such encoding may asymmetrically redistribute the informational content of the original bit sequence over the codeword. Therefore, a frequency-diversity scheme that indiscriminately assigns sections of the resulting codeword to the various frequencies used by the diversity scheme may produce a sub-optimal frequency-diversity gain. Thus, designing a frequency-diversity transmission scheme suitable for the encoding algorithm to be utilized by a transmitter may provide improved frequency-diversity gains.

SUMMARY OF THE INVENTION

In accordance with the present disclosure, certain disadvantages and problems associated with mobile communication have been substantially reduced or eliminated. In particular, certain devices and techniques for providing mobile telecommunication service are described.

In accordance with one embodiment of the present disclosure, a method of wirelessly transmitting control information includes generating control information comprising a plurality of control bits and encoding the control bits using a block code that outputs an encoded bit sequence comprising encoded bits $b(0)$, $b(1)$, ..., $b(19)$. The control bits are encoded using the block code by generating a linear combination of a plurality of basis sequences. The method also includes dividing the encoded bits into a first group and a second group. The first group includes the encoded bits $\{b(0), b(1), b(5), b(6), b(8), b(11), b(12), b(14), b(17), b(19)\}$ and the second group includes the encoded bits $\{b(2), b(3), b(4), b(7), b(9), b(10), b(13), b(15), b(16), b(18)\}$. Additionally, the method includes transmitting the first group of encoded bits on a first set of carriers and transmitting the second group of encoded bits on a second set of carriers. The second set of carriers have different frequencies from the first set of carriers.

In accordance with other embodiments of the present disclosure, methods for decoding control information transmitted according to such methods are provided. Additionally, according to yet other embodiments, apparatuses and systems for implementing such encoding or decoding methods, or variations thereof, are also provided.

Important technical advantages of certain embodiments of the present invention include improved use of frequency diversity in the communication of feedback information. Particular embodiments may be to increase the frequency-diversity gain achieved by a wireless transmitter. Additionally, particular embodiments may be able to provide such benefits with minimal implementation complexity. Other advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIG. 2 is a table that includes a set of basis sequences that may be used to encode control information;

FIG. 3 is a table that includes a set of basis sequences that may be used as an alternative to the set shown in FIG. 2;

FIG. 4A is a minimum slot Hamming distance profile for an example encoding scheme that uses the basis sequences of FIG. 2;

FIG. 4B is a minimum slot Hamming distance profile for the example encoding scheme when the encoded bits are interleaved by a first interleaver;

FIG. 4C is a minimum slot Hamming distance profile for the example encoding scheme when the encoded bits are interleaved by a second interleaver;

FIG. 5 shows a comparison of various interleaving options that may be used with the example encoding scheme;

FIG. 6A is a minimum slot Hamming distance profile for the example encoding scheme when the encoded bits are interleaved by a third interleaver;

FIG. 6B is a table that includes an alternative set of basis sequences that may be used to achieve the interleaving performed by the third interleaver;

FIG. 7A is a minimum slot Hamming distance profile for the example encoding scheme when the encoded bits are interleaved by a fourth interleaver;

FIG. 7B is a table that includes an alternative set of basis sequences that may be used to achieve the interleaving performed by the fourth interleaver;

FIG. 8 is a minimum slot Hamming distance profile for a second example encoding scheme that uses the basis sequences of FIG. 3;

FIG. 9 shows a comparison of various interleaving options that may be used with the second example encoding scheme;

FIG. 10A is a minimum slot Hamming distance profile for the second example encoding scheme when the encoded bits are interleaved by a fifth interleaver;

FIG. 10B is a table that includes an alternative set of basis sequences that may be used to achieve the interleaving performed by the fifth interleaver;

DETAILED DESCRIPTION OF THE INVENTION

Figure 1:
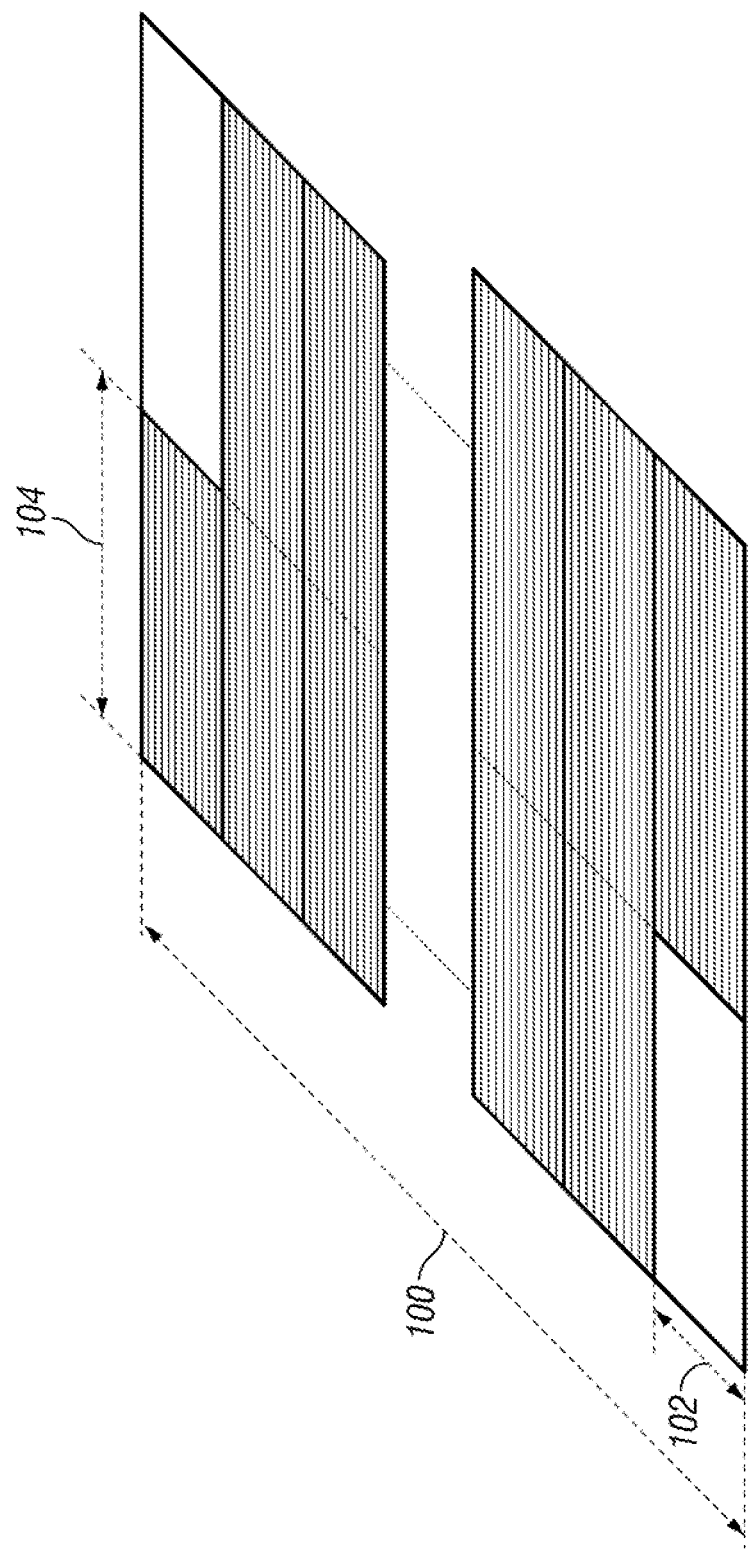
FIG. 1 illustrates a carrier spectrum for an example communication system.

FIG. 1 is a time-frequency diagram of the transmissions resources available in a carrier spectrum 100 of an example communication system. The transmission resources in carrier spectrum 100 are divided by frequency into multiple portions 102 and by time into multiple slots 104. In particular, FIG. 1 illustrates how a terminal may exploit frequency diversity when transmitting control signaling by transmitting the relevant signaling in multiple different portions 102 of the carrier spectrum 100 (as shown by the filled slots 104 in FIG. 1). By transmitting control signaling in this manner, the terminal can increase its resistance to frequency-selective fading. As a result, the overall transmission may experience a frequency-diversity gain, thereby increasing the likelihood that the control information will be successfully received by the intended receiver, such as a base station serving the terminal. Furthermore, the terminal may attempt to maximize the achieved frequency diversity by using carrier frequencies in portions 102 located at opposite edges of the overall carrier spectrum 100 to transmit the various portions of the control signaling, as shown in FIG. 1.

As one example, Release 8 of the Long Term Evolution (LTE) communication standard requires that wireless terminals (or "user equipment (UEs)") utilize a scheme such as the one illustrated by FIG. 1 when transmitting L1/L2 control information if the mobile terminal has not been assigned an uplink resource for data transmission. In such cases, the terminal transmits this L1/L2 control information on the Physical Uplink Control CHannel (PUCCH) using uplink resources (or "resource blocks") that are specifically designated for uplink L1/L2 control. Each such resource block spans a portion 102 of carrier spectrum 100 that consists of twelve (12) frequency subcarriers within one of two slots 104 that make up an LTE uplink subframe. In order to provide frequency diversity, the resource blocks used for such transmissions frequency hop on the boundary of carrier spectrum 100. That is, one of the resource blocks consists of the twelve subcarriers in the uppermost portion 102 of carrier spectrum 100 within the first slot 104 of a subframe and the other transmission resource consists of the same number of subcarriers at the lowermost portion 102 of the spectrum during the second slot 104 of the same subframe, or vice versa. If more resources are needed for uplink L1/L2 control signaling, e.g., in the case of a very large overall transmission bandwidth supporting a large number of users, additional resource blocks can be assigned in a portion 102 of carrier spectrum 100 next to the previously assigned resource blocks.

For certain communication technologies, terminals may use such techniques to transmit feedback information indicating whether scheduled downlink transmissions were successfully received by the terminal and/or providing information regarding the uplink and/or downlink channels over which the terminal is communicating with the access network. For example, LTE terminals transmit Hybrid Automatic Repeat Request (HARQ) Acknowledgement/Negative Acknowledgement (ACK/NACK) feedback bits every subframe indicating whether or not the terminal successfully received a scheduled transmission from the access network. Additionally or alternatively, certain technologies may expect a terminal to transmit feedback bits providing channel state information for a channel or channels used by the terminal. This channel state information may represent any information describing the relevant channel(s) or describing operating parameters to be used in transmitting over the relevant channel(s). For example, feedback bits may provide channel state information including channel quality indicators (CQIs), rank indicators (RIs) and precoding matrix indicators (PMIs) in support of multi-antenna transmissions.

While this feedback information can be as simple as a single bit for some technologies, the growing complexity of advanced communication technologies has resulted in increasingly more feedback being transmitted between wireless terminals and access networks.

For instance, certain advanced communication networks rely on "carrier aggregation" to utilize an expanded carrier spectrum comprised of multiple, smaller spectrums (each referred to as "component carriers"). Terminals supporting carrier aggregation can transmit or receive data on multiple component carriers simultaneously, thereby permitting more data to be exchanged between the terminal and the access network. The use of carrier aggregation, however, can increase the amount of control signaling that a terminal is expected to transmit. Terminals supporting carrier-aggregation may be expected to provide feedback information for multiple component carriers each subframe. Depending on the specific requirements of a particular communication technology, a terminal could be expected to provide feedback each subframe on the complete set of component carriers used under the relevant technology or some appropriate subset, such as the set of component carriers currently configured for use by a base station serving the terminal or the set of component carriers currently activated for the terminal. Thus, a terminal supporting carrier aggregation may sometimes need to transmit feedback information for multiple components carriers in a single subframe.

To satisfy these feedback requirements, a terminal may transmit a control message that includes A bits of feedback information, a(0), a(1), . . . , a(A−1). This control message may utilize a particular message format that establishes pre-determined locations for a feedback bit or multiple feedback bits associated with each of the monitored component carriers. The specific number of bits transmitted for each component carrier may vary. For example, for some systems that support multiple-input multiple-output (MIMO) and spatial diversity transmission schemes, the number of feedback bits per component carrier vary depending on whether the terminal is configured to utilize spatial feedback bundling. Unneeded feedback bits (such as those associated with a component carrier for which no scheduling information was successfully received, or those associated with a single-codeword transmission that requires only one of multiple allotted feedback bits) may be set to a fixed value, e.g., "0" or "NACK." In general, the feedback bits in the message may provide feedback on the relevant component carriers in any appropriate manner. In particular embodiments, the terminal may be configured by the network to make scheduling requests (SR) with a pre-determined frequency. When the terminal is to provide feedback bits in a subframe that allows scheduling requests, an SR bit (with, e.g., "1" representing a positive scheduling request and "0" representing a negative scheduling request) can be appended to the feedback bit sequences. Thus, the control message may also include an SR bit or another form of scheduling request, in addition to the feedback bits. As noted above, in certain embodiments, the terminal is configured to transmit feedback bits providing channel state information. In particular embodiments, the channel state information may include channel quality indicators (CQIs), rank indicators (RI), and precoding matrix indicators (PMIs) in support of multi-antenna transmissions.

After generating the control message, the terminal may then encode the message, including the feedback information, to facilitate transmission of the message to the access network. The terminal may use an (N, A) block code to encode the A feedback bits, with N being the desired number of encoded bits to be output by the encoding process. LTE terminals, as one example, encode the generated feedback information using the LTE (20, A) block code defined in the 3GPP Specification 3GPP TS 36.212, Version 9.1.0, "Multi-plexing and Channel Coding," which is incorporated by reference herein. For such terminals, the resulting codewords are a linear combination of up to thirteen (13) specific basis sequences (denoted $M_{i,n}$) as shown in the table of FIG. 2. The block encoding of the feedback information produces an encoded block, b(0), b(1), . . . , b(19), that has the form:

$$b(k) = \sum_{n=0}^{A-1} (a(n)M_{k,n}) \bmod 2, \text{ where } k = 0, 1, \ldots, 19. \qquad \text{Equation (1).}$$

The encoded bits of feedback information, b(0), b(1), . . . , b(N), are then modulated onto a set of M modulation symbols, s(0), s(1), . . . , s(M), for transmission to the access network. For example, returning to the LTE (20, A)-encoded example, the encoded feedback information, b(0), b(1), . . . , b(19), are modulated onto a sequence of modulation symbols, s(0), s(1), . . . , s(19), such that:

$$s(k) = \frac{1}{\sqrt{2}}[(1 - 2b(2k)) + j(1 - 2b(2k+1))] \text{ and } k = 0, 1, \ldots, 9. \qquad \text{Eq. (2).}$$

The terminal may then transmit the resulting modulation symbols in multiple groups, at the same or different times, over different frequencies, as shown in FIG. 1. As explained above, the frequencies used for the different groups may be chosen to maximize the frequency diversity achieved in the transmission of the modulation symbols, thereby reducing the chances that frequency-selective fading will prevent the feedback information from being successfully received.

A straightforward manner of modulating and transmitting the encoded feedback information might be to modulate the first half of the bits from the encoded feedback information, in order, on a first set of modulation symbols and to modulate the second half of the bits, in order, on a second set of modulation symbols. The terminal could then transmit this first set and second set in different portions 102 of carrier spectrum 100. For instance, in an LTE system using the LTE (20, A) block code, the encoding of A bits of feedback information would produce a 20-bit codeword. An LTE terminal could modulate the first ten bits, $b_o$=[b(0), b(1), . . . , b(9)], of encoded feedback information onto a first set of five quadrature phase-shift keyed (QPSK) symbols, $s_o$=[s(0), s(1), . . . , s(4)], and modulate the second ten bits, $b_1$=[b(10), b(11), . . . , b(19)], onto a second set of five QPSK symbols, $s_1$=[s(5), s(6), . . . , s(9)]. The terminal could then transmit the first five QPSK symbols, $s_o$=[s(0), s(1), . . . , s(4)], in the first slot of a particular subframe on one edge of carrier spectrum 100 and transmit the second five QPSK symbols, $s_1$=[s(5), s(6), . . . , s(9)], in the second slot on an opposite edge of carrier spectrum 100. Thus, the first half (i.e., the first ten bits) of the codeword would be transmitted over a first set of subcarriers having one carrier frequency and the second half would be transmitted over a second set of subcarriers having a different carrier frequency.

However, assigning the encoded bits of feedback information to carrier frequencies in this manner may not produce effective frequency diversity for all possible sizes of feedback information. For example, an LTE terminal using this mapping scheme to transmit Format 2 PUCCH messages would be unable to effectively achieve frequency diversity when the feedback information carries more than five bits. For the block codes used in LTE, the block error rate (BLER) experienced at the receiver deteriorates significantly when the number of information bits (A) increases from 5 to 6. This deterioration is caused primarily by the fact that the sixth bit of the original feedback information affects only the second half of the encoded bits in the codeword output by LTE's (20, A) block code (as a result of the sixth basis sequence, $M_{i,5}$, having "0" values for its first ten bits). Because the bits in the second half of the codeword would all be transmitted on the second set of subcarrier frequencies under this assignment scheme, the sixth bit of the original feedback information would not receive any of the benefit of the frequency diversity resulting from transmitting the codeword over two different sets of subcarrier frequencies. Thus, an LTE terminal may not be able to provide full frequency diversity for all feedback information when assigning the encoded bits to subcarriers in order.

However, simply rearranging the order of the bits in the generated codeword in an ad hoc manner before assigning portions of the codeword to different portions 104 of carrier spectrum 100 also may not maximize the frequency-diversity gain achieved by the transmission. To illustrate, two example interleavers (Interleaver A and Interleaver B) that might be used to rearrange the encoded bits of an LTE (20,A) codeword are described below:

Interleaver A:

| [b(0) | b(4) | b(8)  | b(12) | b(16) | b(2) | b(6) | b(10) | b(14) | b(18)  |
|-------|------|-------|-------|-------|------|------|-------|-------|--------|
| b(1)  | b(5) | b(9)  | b(13) | b(17) | b(3) | b(7) | b(11) | b(15) | b(19)] |

Interleaver B:

| [b(0)  | b(6) | b(18) | b(2)  | b(1)  | b(17) | b(10) | b(5) | b(13) | b(9)   |
|--------|------|-------|-------|-------|-------|-------|------|-------|--------|
| b(14)  | b(3) | b(8)  | b(15) | b(11) | b(12) | b(16) | b(7) | b(4)  | b(19)] |

As the two interleaving patterns indicate, Interleaver A and Interleaver B rearrange the encoded bits in an attempt to change how the information content of the encoded bits is divided between slots 104 (and, thus, between portions 102 of carrier spectrum 100). Despite this rearrangement, both Interleaver A and Interleaver B are still unable to provide optimal frequency diversity. One reason for this failure is that these channel interleavers were designed on an ad hoc basis and provide unstable performance behaviors across the range of feedback information sizes that may be used by a terminal. For instance, the performance of Interleaver A when carrying A=5 bits of feedback information is almost 1 dB worse than that which would result without channel interleaving. Similarly, Interleaver B does not provide any improvement when carrying A≥10 bits of feedback information. Additionally, the extensive redistribution of encoded bits between the two halves of the codeword and the extensive reordering of bits within each half unnecessarily adds to implementational complexity.

As an alternative to interleaving the encoded bits of feedback information after encoding has been completed, the original feedback information may be encoded using a different set of encoding basis sequences. In particular, the set of encoding basis sequences can be modified to ensure that a greater number of the unencoded feedback bits have their informational content distributed between the multiple frequencies used to transmit the encoded bits. For example, the set of basis sequences used with the (20, A)-encoded LTE example could be altered by removing the encoding basis sequence $M_{i,5}$, as shown in FIG. 3. However, using this altered set of encoding basis sequences for the (20, A)-encoded LTE example also proves to be a sub-optimal solution. As with Interleaver B, this solution does not provide any improvement when carrying A≥10 bits of feedback information. Additionally, the use of this particular modification to the basis sequences will reduce by one the maximum number of feedback bits that can be transmitted.

Thus, to improve the frequency diversity achievable by a terminal across a range of different feedback information sizes, the present disclosure provides a rigorous performance analysis of possible candidates for an improved bit-swapping pattern. From this rigorous performance analysis, design guidelines are distilled to guide an exhaustive search for the optimal set of candidates. Without the guidelines distilled from this performance analysis, it would be impractical, if not impossible, to perform an exhaustive search for an optimal interleaver in many cases. For the (20, A)-encoded LTE example, there would be $20! = 2.4329 \times 10^{18}$ interleaver candidates. As explained further below, the described design guidelines can reduce the search space for that specific example to $$\frac{1}{2}\binom{20}{10} = 92{,}378$$

bipartite assignments, making an exhaustive search for the optimal swapping pattern significantly more feasible.

For this performance analysis, assume a terminal transmits feedback information as a coded symbol sequence $[s_0, s_1]$ on the two edges of a contiguous carrier spectrum 100, and a base station in the access network receives the encoded symbol sequence using L diversity receive antennas. In a Raleigh fading environment, if the frequency responses at the edges of carrier spectrum 100 are independent, the average pairwise error probability (PEP) of a particular sequence of the coded modulation symbols $[s_0, s_1]$ being mistaken for another sequence of coded modulation symbols $[\hat{s}_0, \hat{s}_1]$ at the serving base station is upper-bounded by:

$$PEP \leq \left(1 + \frac{3E_s}{N_0}\|s_0 - \hat{s}_0\|^2\right)^{-L}\left(1 + \frac{3E_s}{N_0}\|s_1 - \hat{s}_1\|^2\right)^{-L}, \quad \text{Equation (3)},$$

where $E_s/N_0$ is the average received signal-to-noise ratio (SNR) per receive antenna. The coded symbol sequence $[s_0, s_1]$ is related to the coded sequence $[b_0, b_1]$ based on the utilized modulation scheme (e.g., in the case of the LTE example discussed above, the QPSK modulation scheme described in Equation (2)). Therefore, the pairwise error probability can be further expressed as:

$$PEP \leq \left(1 + \frac{6E_s}{N_0}d_H(b_0,\hat{b}_0)\right)^{-L}\left(1 + \frac{6E_s}{N_0}d_H(b_1,\hat{b}_1)\right)^{-L}, \quad \text{Equation (4)}$$

where $d_H(b_f, \hat{b}_f)$, f=0,1, is the Hamming distance for slot f. The average block error rate of the received transmission is dominated by the worst case pairwise error probability:

$$\max PEP \leq \left(1 + \frac{6E_s}{N_0}d_{min,0}\right)^{-L}\left(1 + \frac{6E_s}{N_0}d_{min,1}\right)^{-L}, \quad \text{Equation (5)}$$

where $d_{min,f}$, f=0,1, is the Hamming distance of slot f for the worst-case coded sequence pair.

Consider the case where $d_{min,0}$ and $d_{min,1}$ are both greater than zero. The dominant PEP is upper-bounded by $$\max PEP \leq \left(\frac{6E_s}{N_0}\sqrt{d_{min,0}d_{min,1}}\right)^{-2L}, \quad \text{Equation (6)}$$

That is, full frequency-hopping and receive antenna diversity can be obtained because the dominant error probability diminishes with the −2 L th power of the SNR.

If, for example, $d_{min,0}>0$ but $d_{min,1}=0$, the dominant PEP is then upper-bounded by $$\max PEP \leq \left(\frac{6E_s}{N_0}\max(d_{min,0}, d_{min,1})\right)^{-L}, \quad \text{Equation (7)}$$

Thus, frequency-hopping diversity is lost if one of the minimum slot Hamming distances is zero.

As Equation (6) indicates, full frequency-hopping and receive antenna diversity can be attained only if $\min(d_{min,0}, d_{min,1})>0$. Hence, raising $\min(d_{min,0},d_{min,1})$ away from zero should be a priority for designing an effective interleaver. An interleaver, by definition, cannot increase the total minimum Hamming distance across the two slots. Hence, for a fixed value of $(d_{min,0}+d_{min,1})$, the dominant PEP in Equation (6) can be minimized if the interleaver distributes the total Hamming distance evenly between the two slots, in which case min $(d_{min,0},d_{min,1})$ is also maximized. Additionally, the inequality $\min(d_{min,0},d_{min,1})>0$ holds true only when the binary coding rate, $r_c$ (which for the (20, A) encoded LTE example, equals A/20) is no more than ½. Therefore, maximizing the value of $\min(d_{min,0},d_{min,1})$ should improve interleaver performance for A≤10. Accordingly, using the principles and equations introduced above, certain design guidelines can be derived to assist in the design of improved interleavers Design Guideline 1: The Value of $\min(d_{min,0},d_{min,1})$ Should be Maximized for cases with A≤10.

In cases where full frequency-hopping diversity is not attainable, the dominant PEP is upper bounded by Equation (7). Better performance can therefore be obtained if the designed interleaver maximizes the nonzero minimum slot Hamming distance. This goal leads to Design Guideline 2.

Design Guideline 2: The Value of $\max(d_{min,0},d_{min,1})$ Should be Maximized for cases with A>10.

The effectiveness of the example interleavers described above can be measured against these design guidelines. To provide a baseline for evaluating these interleavers, FIG. 4A includes a minimum slot Hamming distance profile for the example (20, A)-encoding scheme when used without any interleaving.

Interleaver A A minimum slot Hamming distance profile for Interleaver A is provided in the table of FIG. 4B. As indicated by FIG. 4B, Interleaver A lifts the value of $\min(d_{min,0},d_{min,1})$ away from zero for cases where A=6, 7, 8, 9 and 10. Hence, full frequency-hopping diversity gains can be obtained with Interleaver A for up to 10 information bits. However, for A=5, the value of $\min(d_{min,0},d_{min,1})$ is reduced from 3 to 1 when Interleaver A is introduced. That is, the design of Interleaver A violates Guideline 1.

Interleaver B—A minimum slot Hamming distance profile for Interleaver B is provided in the table of FIG. 4C. As indicated by FIG. 4C, Interleaver B lifts the value of $\min(d_{min,0},d_{min,1})$ away from zero for cases with A=6, 7, 8 and 9. However, the value of $\min(d_{min,0},d_{min,1})$ is still zero for A=10. Hence, full frequency-hopping diversity gains can be obtained with Interleaver B for up to 9 information bits. Note also that, for A=11, $\max(d_{min,0},d_{min,1})=4$ is lower than for Interleaver A. That is, the design of Interleaver B violates both guidelines.

This analysis underscores the difficulty of improving frequency diversity for feedback information of this type through the design of an optimal channel interleaver. For example, using a design approach based only on the first two guidelines, it would be essentially impossible to optimize for the (20, A) block-coded LTE example since would be $20!=2.4329\times10^{18}$ interleaver candidates in that scenario. However, adding Design Guideline 3 below as a constraint makes identifying an acceptable candidate significantly more manageable.

Design Guideline 3: Rearranging a Group Code Bits within the Same Slot does not Affect Link Performance.

The performance bounds in Equations (3)-(6) are dependent upon how the total minimum Hamming distance $(d_{min,0}+d_{min,1})$ is distributed between the two slots, but not upon the ordering of the bits within the corresponding slots. That is, given the same set of coded bits distributed in the same manner between the two slots, the ordering of these bits within their respective slot will not affect the slot Hamming distance. Thus, rearranging a group code bits within the same slot has no effect on the link performance. Considering this point in selecting the interleaver can transform the design problem from a daunting channel interleaver search problem to a manageable bipartite assignment problem.

Solutions for LTE (20,A)-Encoding with Standard Basis Sequences

For the (20, A)-encoded LTE example using the standard basis sequences (i.e., those in the table of FIG. 2), this principle reduces the problem to one of assigning the 20 coded bits into two subsets of 10 bits each. The optimization problem then becomes one of searching for a bipartite assignment according to the above design guidelines. This shrinks the search space to $$\frac{1}{2}\binom{20}{10} = 92{,}378$$

bipartite assignments. An exhaustive search for the optimal design becomes far more feasible as a result.

FIG. 5 contains a table comparing minimum slot Hamming distances for the example (20, A) LTE block-encoding without interleaving and using various interleaving alternatives. Of the 92,378 possible bipartite assignments for this example encoding, only 19,744 assignments satisfy the inequality min $(d_{min,0},d_{min,1})>0$ for all A≤10. Out of these, only 1301 bipartite assignments also have a minimum slot Hamming distance profile at least as large as those for a non-interleaved implementation across the entire range of A. The range of $\min(d_{min,0},d_{min,1})$ for these 1301 bipartite assignments is listed in the second column of the table in FIG. 5. As the table of FIG. 5 indicates, the value of $\min(d_{min,0},d_{min,1})$ for these 1301 candidates is always equal to or higher than those of the non-interleaved implementation.

The table of FIG. 5 also indicates that the value of $\min(d_{min,0},d_{min,1})$ for the Interleaver A and Interleaver B described above do not achieve the maximum values in many cases. More specifically, the slot minimum distances of Interleaver A are worse than those produced when no interleaving is performed for A=4 or 5 bits, while Interleaver B does not maintain full frequency hopping diversity when carrying A=10 bits. Furthermore, an exhaustive search of the possible bipartite assignments for this example reveals that no bipartite assignment can simultaneously achieve the maximum values of min($d_{min,0},d_{min,1}$)=3 for A=6 and min($d_{min,0}$, $d_{min,1}$)=2 for A=8. Thus, two different improved solutions are defined here for the (20, A) block-coded LTE example.

Solution 1

The first solution prioritizes the minimum distance for A=7 and 8 bits to ensure good performance for larger payloads. There are only two bipartite assignments that achieve min ($d_{min,0},d_{min,1}$)=2 for A=7 and 8 bits for this LTE example. One of them also achieves the upper bound min($d_{min,0},d_{min,1}$)=4 for A=3 bits. This solution (referred to here as "Bit Assignment I") can be achieved by assigning the coded bits such that a first set of coded bits including {b(0), b(1), b(2), b(3), b(4), b(6), b(7), b(8), b(13), b(19)} are transmitted in one slot and a second set of coded bits including {b(5), b(9), b(10), b(11), b(12), b(14), b(15), b(16), b(17), b(18)} is transmitted in the other slot. As noted above, the ordering of the coded bits within their respective slots will not affect the slot Hamming distance. So, any of the various interleavers that implement this assignment of coded bits to slots should produce the same slot Hamming distance regardless of how such interleavers order the individual bits within a particular slot.

While any suitable swapping could be used to produce the described bit-to-slot assignments, one example of how this assignment might be achieved for the codeword output by the (20, A) LTE encoding process would be to:
   swap b(5) with b(13); and
   swap b(9) with b(19)
Thus, an improved bit assignment for the (20, A)-encoded LTE example can be achieved with a modest 2-step bit-swapping operation. A minimum slot Hamming profile for Bit Assignment I is shown in the table of FIG. 6A, and a comparison of the minimum slot Hamming distances for Bit Assignment I is included in FIG. 5.

The assignment achieved by the above bit-swapping could be implemented by an Interleaver C described by the following interleaving pattern (noting again that the order of the bits assigned to a particular slot will have no affect on the slot Hamming distance):
Interleaver C:

| [b(0) | b(1) | b(2) | b(3) | b(4) | b(6) | b(7) | b(8) | b(13) | b(19) |
|---|---|---|---|---|---|---|---|---|---|
| b(5) | b(9) | b(10) | b(11) | b(12) | b(14) | b(15) | b(16) | b(17) | b(18)] |

Alternatively, Bit Assignment I could also be achieved by adopting an alternative set of encoding basis sequences from those used in Release 8 LTE (i.e., the basis sequences shown by FIG. 2). For example, in lieu of interleaving the encoded bits after encoding has been completed, the alternative set of encoding basis sequences shown by the table of FIG. 6B could be used to implement the optimal assignment proposed here for the (20, A)-encoded LTE example.

Solution 2

A second solution for the bipartite assignment will provide the maximum value for min($d_{min,0},d_{min,1}$)=3 when A=6 bits. There are only five bipartite assignments that achieve this maximum, and one of them also achieves the upper bound min($d_{min,0},d_{min,1}$)=4 for A=3 bits. This solution (referred to here as "Bit Assignment II") can be achieved by assigning the coded bits such that a first set of coded bits including {b(0), b(2), b(4), b(6), b(7), b(8), b(9), b(11), b(17), b(18)} is transmitted in one slot and a second set of coded bits including {b(1), b(3), b(5), b(10), b(12), b(13), b(14), b(15), b(16), b(19)} is transmitted in the other slot. Bit Assignment II maximizes the value of min($d_{min,0},d_{min,1}$) across the whole range of A. Again, because the ordering of the coded bits within their respective slots will not affect the slot Hamming distance, any of the various interleavers that implement this assignment of coded bits to slots should have the same slot Hamming distance regardless of how such interleavers order the individual bits within a particular slot.

While any suitable swapping could be used to produce the described bit-to-slot assignments, one example of how this assignment might be achieved for the codeword output by the (20, A) LTE encoding process would be to:
   swap b(1) with b(11)
   swap b(3) with b(17)
   swap b(5) with b(18)
Thus, an improved bit assignment for the (20, A)-encoded LTE example can be achieved with a modest 3-step bit-swapping operation. A minimum slot Hamming profile for Bit Assignment II is shown in the table of FIG. 7A, and a comparison of the minimum slot Hamming distances for Bit Assignment II is included in FIG. 5.

The assignment achieved by the above bit-swapping could be implemented by an Interleaver D described by the following interleaving pattern:
Interleaver D:

| [b(0) | b(2) | b(4) | b(6) | b(7) | b(8) | b(9) | b(11) | b(17) | b(18) |
|---|---|---|---|---|---|---|---|---|---|
| b(1) | b(3) | b(5) | b(10) | b(12) | b(13) | b(14) | b(15) | b(16) | b(9)]. |

Alternatively, Bit Assignment II can be achieved by adopting another alternative set of encoding basis sequences. For example, in lieu of interleaving the encoded bits after encoding has been completed, the alternative set of encoding basis sequences shown by the table of FIG. 7B could be used to implement Bit Assignment II for the (20, A)-encoded LTE example.

Solutions for LTE (20,A)-Encoding Using a Reduced Set of Basis Sequences

In addition to Bit Assignment I and Bit Assignment II, the above analysis can also be used to improve frequency-diversity gain when encoding is performed using the modified set of basis sequences described above (and shown in FIG. 3) in which $M_{i,5}$ has been removed. As noted above, when the basis sequences are modified only by the removal of the $M_{i,5}$ sequence, the resulting codeword can be transmitted with full frequency diversity without interleaving when carrying up to 9 bits. The table of FIG. 8 provides a minimum slot Hamming distance profile for an encoding scheme using this reduced set of basis sequences. As FIG. 8 shows, for A=10 bits, encoding using the reduced set of basis sequences still does not attain the optimal performance. Thus, the above guidelines can also be used to design a bit-swapping pattern to improve the performance of terminals using the reduced set of basis sequences to encode control information.

FIG. 9 contains a table comparing minimum slot Hamming distances for various interleaving alternatives for a (20, A) LTE block-encoding scheme that utilizes the reduced set of basis sequences shown in FIG. 3. An exhaustive search of the 92,378 bipartite assignments that can be produced with this reduced set or basis sequences reveals only 13,340 assignments that satisfied the inequality min($d_{min,0},d_{min,1}$)>0 for all A≤10. Out of these, only 94 bipartite assignments have minimum slot Hamming distances at least as large as those provided without any interleaving, as shown by the table of FIG. 9. The range of min($d_{min,0},d_{min,1}$) for these 94 bipartite assignments is listed in the second column of FIG. 9. It can be observed that the value of $\min(d_{min,0},d_{min,1})$ for these 94 candidates is always equal to or higher than those attained without interleaving. The exhaustive search of candidates reveals the maximum value of $\min(d_{min,0},d_{min,1})$ for A=3 (i.e., $\min(d_{min,0},d_{min,1})$=4) and the maximum value of $\min(d_{min,0},d_{min,1})$ for A=8 (i.e., $\min(d_{min,0},d_{min,1})$=2) cannot be simultaneously achieved by any bipartite assignment (or interleaver) for a codeword encoded without the $M_{i,5}$ basis sequence.

Furthermore, there is only one bipartite assignment that achieves the maximum value of $\min(d_{min,0},d_{min,1})$ for A=8 bits. This bipartite assignment (referred to here as the "Reduced-Set Bit Assignment") can be achieved by assigning the coded bits such that a first set of encoded bits including {b(0), b(1), b(5), b(6), b(8), b(11), b(12), b(14), b(17), b(19)} are transmitted in one slot and a second set of coded bits including {b(2), b(3), b(4), b(7), b(9), b(10), b(13), b(15), b(16), b(18)} are transmitted in the other slot. Once again, the ordering of the coded bits within their respective slots will not affect the slot Hamming distance.

While any suitable swapping could be used to produce the described bit assignments, one example of how this assignment might be achieved for the codeword output by (20, A) LTE encoding using the reduced set of basis sequences would be to:

swap b(2) with b(11);
swap b(3) with b(12);
swap b(4) with b(14);
swap b(7) with b(17); and
swap b(9) with b(19)

Thus, an improved bit assignment for the (20, A)-encoded LTE example using the reduced set of basis sequences can be achieved with a 5-step bit-swapping operation. A minimum slot Hamming profile for the Reduced-Set Bit Assignment is shown in the table of FIG. 10A, and a comparison of the minimum slot Hamming distances for the Reduced-Set Bit Assignment is included in FIG. 9.

The assignment achieved by the above bit-swapping could be implemented by an Interleaver E described by the following interleaving pattern:
Interleaver E

[b(0)  b(1)  b(5)  b(6)  b(8)  b(11) b(12) b(14) b(17) b(19)
b(2)  b(3)  b(4)  b(7)  b(9)  b(10) b(13) b(15) b(16) b(18)].

The Reduced-Set Bit Assignment may be most useful when implemented as a post-encoding bit-swapping for codewords produced by a terminal already configured to use the reduced set of basis sequences, thereby permitting a terminal to achieve improved frequency-diversity gain without requiring further changes to the basis sequences used by the terminal (as might be required to instead implement Bit Assignment I on the same terminal). Nonetheless, under certain circumstances, it may still be desirable to implement the Reduced-Set Bit Assignment by modifying the reduced set of basis sequences even further. For example, in lieu of bit-swapping, the alternative set of encoding basis sequences shown by the table of FIG. 10B could be used to implement the Reduced-Set Bit Assignment.

Overall, by using the design guidelines articulated above to develop improved techniques for assigning encoded bits to particular portions 102 of carrier spectrum 100, increased frequency-diversity gains can be achieved when communicating control information between a terminal and the access network in the manner illustrated by FIG. 1. Moreover, the Bit Assignment I and Bit Assignment II formulated above can specifically provide improved frequency-diversity gains when used by terminals implementing encoding schemes such as the standard LTE (20, A) encoding defined by Equation (1) and the basis sequences of FIG. 2. The Reduced-Set Bit Assignment can likewise provide improved frequency-diversity gains when used by terminals implementing the modified LTE (20, A) encoding defined by Equation (1) and the reduced set of basis sequences provided by FIG. 3. Although the description above focuses, for purposes of example, on describing techniques for the standard or modified LTE (20, A) encoding schemes, the design guidelines and principles discussed above can be used, with appropriate modification, to design improved slot/carrier assignments for codewords encoded with other suitable types of encoding. Examples of how the described assignment schemes may be implemented in a communication system, as well as example devices capable of implementing such techniques, are discussed in greater detail below with respect to FIGS. 11-16.

Figure 11:
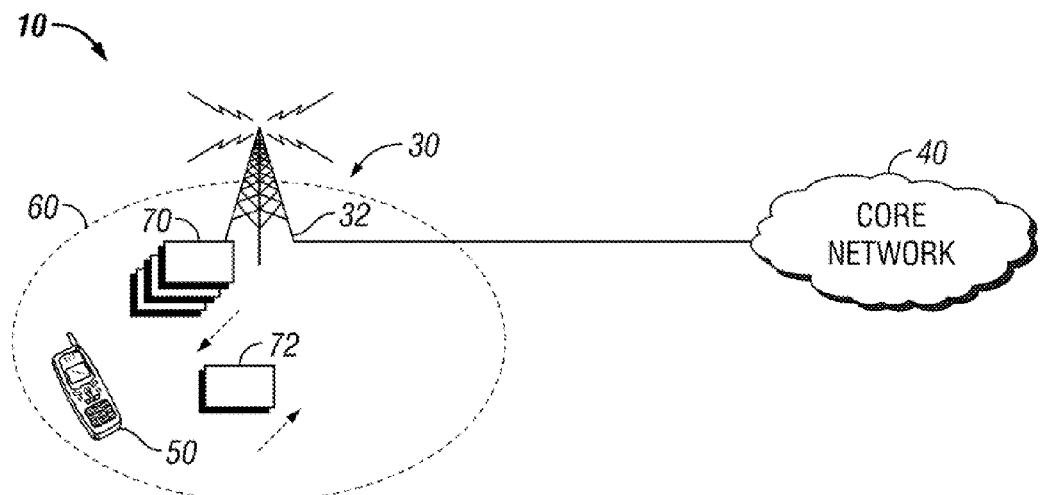
FIG. 11 shows a particular embodiment of a mobile communication system that may implement the various example encoding and interleaving schemes.

FIG. 11 illustrates a mobile communication system 10 that implements the transmission techniques shown by FIG. 1 to improve frequency diversity for certain types of control signaling. Mobile communication system 10 includes an access network 30 capable of communicating wirelessly with a mobile terminal 20 and a core network 40 that provides backhaul delivery of information within mobile communication system 10. By using the bit-assignment techniques suggested above, wireless terminal 20 can increase the frequency diversity experienced by control signaling transmitted by wireless terminal 20. As a result, wireless terminal 20 can reduce the error rate, or otherwise improve its performance, in transmitting the relevant control signaling.

In general, mobile communication system 10 provides mobile communication service to one or more wireless terminals 20 operating within a cell 60, representing a geographic area associated with mobile communication system 10. Mobile communication system 10 may support communication of any suitable type and/or in accordance with any appropriate communication standards including, but not limited to, any Long Term Evolution (LTE), Worldwide Interoperability for Microwave Access (WiMAX), and Wideband Code Division Multiple Access (WCDMA) communication standards.

Wireless terminal 20 represents any device capable of communicating information wirelessly with mobile communication system 10. Examples of wireless terminal 20 include traditional communication devices such as mobile phones, personal digital assistants ("PDAs"), laptop computers, and any other portable communication device suitable for use with communication system 10. For example, in particular embodiments, wireless terminal 20 represents an instance of LTE user equipment (UE). Additionally, in particular embodiments, wireless terminal 20 may also represent automated equipment or devices equipped with components suitable to permit communication with mobile communication system 10, such as devices in a home-automation network. For example, wireless terminal 20 may represent a washing machine, oven, digital video recorder (DVRs), or other home appliances capable of remote management over mobile communication system 10. Although FIG. 2 illustrates, for the sake of simplicity, only a single wireless terminal 20 and a single base station 32, mobile communication system 10 may include any suitable number and configuration of base stations 32 capable of serving any number of wireless terminals 20 including, in particular embodiments, wireless terminals 20 having different capabilities with respect to the carrier spectrum 100 they support.

Access network 30 communicates wirelessly with wireless terminals 20 and serves as an interface between wireless terminals 20 and core network 40. Access network 30 may represent or include a radio access network and/or any elements responsible for providing a radio or air interface for core network 40. For example, in the illustrated embodiment, access network 30 includes one or more base stations 32. Access network 30 may also include base station controllers, access servers, gateways, and/or any additional components suitable for managing radio channels used by base station 32, authenticating users, controlling handoffs between base station 32 and other radio access elements, and/or otherwise managing the interoperation of base stations 32 and interfacing base stations 32 with core network 40.

Base station 32 communicates wirelessly with wireless terminals 20 to facilitate mobile communication for wireless terminals 20. Base stations 32 may include any appropriate elements to communicate with wireless terminals 20 and to interface wireless terminals 20 with core network 40. For example, depending on the communications standards supported by access network 30 and core network 40, each base station 32 may represent or include a base station, a Node B, an evolved Node B (eNode B), a radio base station (RBS), an access point, or any other suitable element capable of communicating with wireless terminals 20 wirelessly.

Core network 40 routes voice and/or data communicated by wireless terminals 20 from access network 30 to other wireless terminals 20 or to other communication devices coupled to core network 40 through landline connections or through other networks. Core network 40 may support any appropriate standards or techniques for routing such communications. For example, in embodiments of wireless terminals 20 that support LTE, core network 40 may represent a System Architecture Evolution (SAE) core network. Core network 40 may also be responsible for aggregating communication for longhaul transmission, authenticating users, controlling calls, metering usage for billing purposes, or other functionality associated with providing communication services. In general, however, core network 40 may include any components suitable for routing and otherwise supporting voice and/or data communications for wireless terminals 20.

In operation, mobile communication system 10 provides telecommunication service to wireless terminal 20. As part of this service, access network 30 communicates wirelessly with wireless terminal 20. For example, in the illustrated embodiment, base station 32 of access network 30 establishes a wireless connection with wireless terminal 20 for communication over radiofrequency (RF) channels, and core network 40 transports voice, data, multimedia, and/or other types of information between various components of access network 30 and between other elements of mobile communication system 10, such as wireline communication devices.

To initiate and manage this connection, wireless terminal 20 and base station 32 will communicate certain types of control signaling between them. Among the control signaling that may be communicated by wireless terminal 20 to base station 32 is feedback information that indicates whether wireless terminal 20 successfully received transmissions that wireless terminal 20 was scheduled to receive from base station 32 and/or requests retransmission of transmissions made by base station 32. This feedback information may represent any appropriate information transmitted by wireless terminal 20 to inform access network 30 of the successful/unsuccessful receipt of scheduled transmissions or to request retransmission of scheduled transmissions. For example, in certain LTE embodiments of mobile communication system 10, the feedback information may represent HARQ feedback bits transmitted by wireless terminal 20 over the PUCCH. In particular embodiments, wireless terminal is configured by the network to make scheduling requests (SR) with a pre-determined frequency. When a wireless terminal is to transmit feedback bits in a subframe that allows scheduling requests, the feedback bits may include an SR bit (with, e.g., "1" representing a positive scheduling request and "0" representing a negative scheduling request). In yet other embodiments, the terminal is configured to transmit feedback bits that provide channel state information in support of multi-antenna transmissions. Examples of this channel state information may include channel quality indicators (CQIs), rank indicators (RIs), and precoding matrix indicators (PMIs). In general, however, this channel state information may represent any appropriate information describing a channel or channels over which wireless terminal 20 is communicating or indicating operating parameters to use in communicating over such channel(s). In the illustrated example, wireless terminal 20 transmits the feedback information as part of an uplink control message 72 that has a format permitting communication of multiple bits of feedback information per subframe. These uplink control messages 72 may represent LTE PUCCH Format 2/2a/2b messages or other appropriate types of control signaling messages.

As part of generating an uplink control message 72 containing feedback information, wireless terminal 20 may encode the feedback information to facilitate transmission of the generated uplink control message 72 to base station 32. Wireless terminal 20 may then assign bits of the resulting codeword to particular slots that are in turn associated with particular portions 102 of a carrier spectrum 100 used by wireless terminal 20. By implementing an assignment that satisfies the design guidelines introduced above, particular embodiments of wireless terminal 20 may provide greater frequency-diversity gain for the transmission of the feedback information than would be achieved using conventional techniques to transmit the feedback information.

In particular embodiments, wireless terminal 20 achieves this improved bit assignment by encoding the feedback bits and then interleaving the bits of the resulting codeword. For example, in LTE embodiments, wireless terminal 20 may utilize the LTE (20, A) block coding scheme to generate a codeword, and then use Bit Assignment I or Bit Assignment II, as described above, to assign the encoded bits to the two transmission slots 104 of a particular subframe. Thus, if using Bit Assignment I, wireless terminal 20 may assign a first group of the encoded bits, including {b(0), b(1), b(2), b(3), b(4), b(6), b(7), b(8), b(13), b(19)}, to a first slot 104 of the subframe (and, thus, to a first set of carriers) and a second group of bits, including {b(5), b(9), b(10), b(11), b(12), b(14), b(15), b(16), b(17), b(18)}, to a second slot 104 of the subframe (and, thus, to a second set of carriers). Similarly, if using Bit Assignment II, wireless terminal 20 may assign a first group of the encoded bits, including {b(0), b(2), b(4), b(6), b(7), b(8), b(9), b(11), b(17), b(18)}, to the first slot and a second set of the encoded bits including {b(1), b(3), b(5), b(10), b(12), b(13), b(14), b(15), b(16), b(19)} to the second slot. In particular embodiments, wireless terminal implements Bit Assignment I or Bit Assignment II through the use of Interleaver C or Interleaver D, respectively.

Alternatively, wireless terminal 20 may achieve similar bit assignments by using a particular set of basis sequences designed to produce a similar relationship between the feedback bits and the encoded information transmitted in the two slots over their associated carriers. For example, by using the basis sequences shown in FIG. 6B instead of the standard basis sequences defined for the LTE (20, A) block code (as shown in FIG. 2), wireless terminal 20 may achieve the same results as encoding with the conventional LTE (20, A) basis sequences and then interleaving with Interleaver C. Similarly, by using the basis sequences shown in FIG. 7B instead of the standard LTE (20, A) basis sequences, wireless terminal 20 may achieve the same results as encoding with the conventional LTE (20, A) basis sequences and then interleaving with Interleaver D. Wireless terminal 20 can then assign the first half of the bits from the resulting codeword to the first slot of the subframe and the second half of the bits to the second slot.

After encoding the information bits and performing any appropriate interleaving or other form of bit-swapping, wireless terminal 20 modulates the encoded bits on modulation symbols. Wireless terminal 20 then transmits a first set of modulation symbols, onto which the first set of encoded bits have been modulated, in the first slot of the relevant subframe. Wireless terminal 20 also transmits a second set of modulation symbols, onto which the second set of encoded bits have been modulated, in the second slot of that subframe. As noted above, the different slots 104 are associated with carriers in different portions 102 of the carrier spectrum 100 used by wireless terminal 20. Thus, wireless terminal 20 transmits the second set of modulation symbols on carriers having a different frequency from the carriers on which the first set of modulation symbols is transmitted. In particular embodiments, wireless terminal 20 transmits the first set of modulation symbols using carriers (e.g., LTE subcarriers) on one edge of carrier spectrum 100 and transmits the second set of modulation symbols using carriers on the other edge of carrier spectrum 100, as shown in FIG. 1.

Base station 32 receives uplink control message 72 and decodes the feedback information encoded in uplink control message 72. As part of the decoding, base station 32 may reverse any interleaving or other forms of bit-swapping wireless terminal 20 may have performed on the feedback information. Alternatively, base station 32 may use a modified set of basis sequences (such as those shown in FIG. 6B or 7B) as appropriate to decode the received feedback information. Depending on the content of the decoded feedback information, base station 32 may then take measures to respond to the feedback, such as retransmitting certain scheduled transmissions to wireless terminal 20 or modifying transmission parameters (e.g., modulation scheme, MIMO configuration) based on the received feedback information. For example, base station 32 may implement a HARQ retransmission process under which base station 32 considers various factors in deciding whether to retransmit scheduled transmissions that the decoded feedback information indicates wireless terminal 20 did not receive or for which the decoded feedback information indicates wireless terminal 20 did not receive the associated scheduling information.

Because of the increased frequency-diversity gain obtained by using the assignment techniques described above, the likelihood of base station 32 successfully receiving (i.e., receiving and decoding without error) the feedback information is greater than if conventional techniques were used. Thus, base station 32 may be able to receive the feedback information with a reduced error rate, wireless terminal 20 may be able to use less power in transmitting feedback information, and/or the performance of wireless terminal 20 in transmitting feedback information may otherwise be improved. Accordingly, particular embodiments of mobile communication system 10 may provide several operational benefits. Specific embodiments, however, may provide some, none, or all of these benefits.

Figure 12:
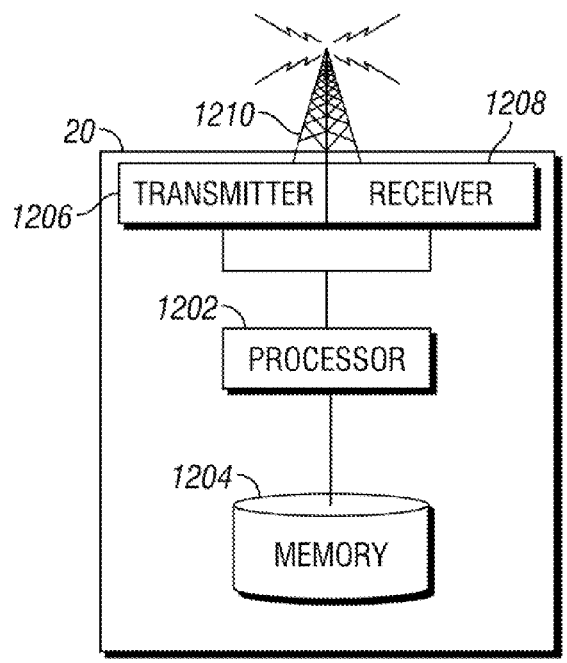
FIG. 12 is a block diagram showing the contents of a particular embodiment of a wireless terminal capable of communicating with the mobile communication system.

FIG. 12 is a block diagram illustrating in greater detail contents of a particular embodiment of a wireless terminal 20. Wireless terminal 20 may utilize the assignment techniques described above when transmitting certain types of control information to access network 30. As shown in FIG. 12, the illustrated embodiment of wireless terminal 20 includes a processor 1202, a memory 1204, a transmitter 1206, a receiver 1208, and one or more antennas 1210.

Processor 1202 may represent or include any form of processing component, including dedicated microprocessors, general-purpose computers, or other devices capable of processing electronic information. Examples of processor 1202 include field-programmable gate arrays (FPGAs), programmable microprocessors, digital signal processors (DSPs), application-specific integrated circuits (ASICs), and any other suitable specific- or general-purpose processors. Although FIG. 12 illustrates, for the sake of simplicity, an embodiment of wireless terminal 20 that includes a single processor 1202, wireless terminal 20 may include any number of processors 1202 configured to interoperate in any appropriate manner.

Memory 1204 stores processor instructions, basis sequences, interleaving patterns, control message formats, and/or any other data utilized by wireless terminal 20 during operation. Memory 1204 may comprise any collection and arrangement of volatile or non-volatile, local or remote devices suitable for storing data, such as random access memory (RAM), read only memory (ROM), magnetic storage, optical storage, or any other suitable type of data storage components. Although shown as a single element in FIG. 12, memory 1204 may include one or more physical components local to or remote from wireless terminal 20.

Antenna 1210 represents any suitable conductor capable of receiving and transmitting wireless signals. Transmitter 1206 transmits radiofrequency (RF) signals over antenna 1210, and receiver 1208 receives from antenna 1210 RF certain signals transmitted by access network 30. Although the example embodiment in FIG. 12 includes certain numbers and configurations of antennas, receivers, and transmitters, alternative embodiments of wireless terminal 20 may include any suitable number of these components. For example, wireless terminal 20 may be equipped with multiple antennas 1210 to facilitate use of multiple-input multiple-output (MIMO) transmission techniques. Additionally, transmitter 1206, receiver 1208, and/or antenna 1210 may represent, in part or in whole, the same physical components. For example, particular embodiments of wireless terminal 20 include a transceiver representing both transmitter 1206 and receiver 1208.

FIGS. 13-16 are flowcharts illustrating example operation of particular embodiments of wireless terminal 20 in transmitting control information using the techniques described above. The steps illustrated in any of FIGS. 13-16 may be combined, modified, or deleted where appropriate. Additional steps may also be added to the example operations. Furthermore, the described steps may be performed in any suitable order. While the techniques described by FIGS. 13-16 may be used to transmit any suitable type of control signaling from wireless terminal 20 to access network 30, or from access network 30 to wireless terminal 20, the description below focuses on an example in which wireless terminal 20 uses these techniques to transmit feedback information indicating whether wireless terminal 20 successfully received scheduled transmissions on the various component carriers for which wireless terminal 20 was scheduled.

Figure 13:
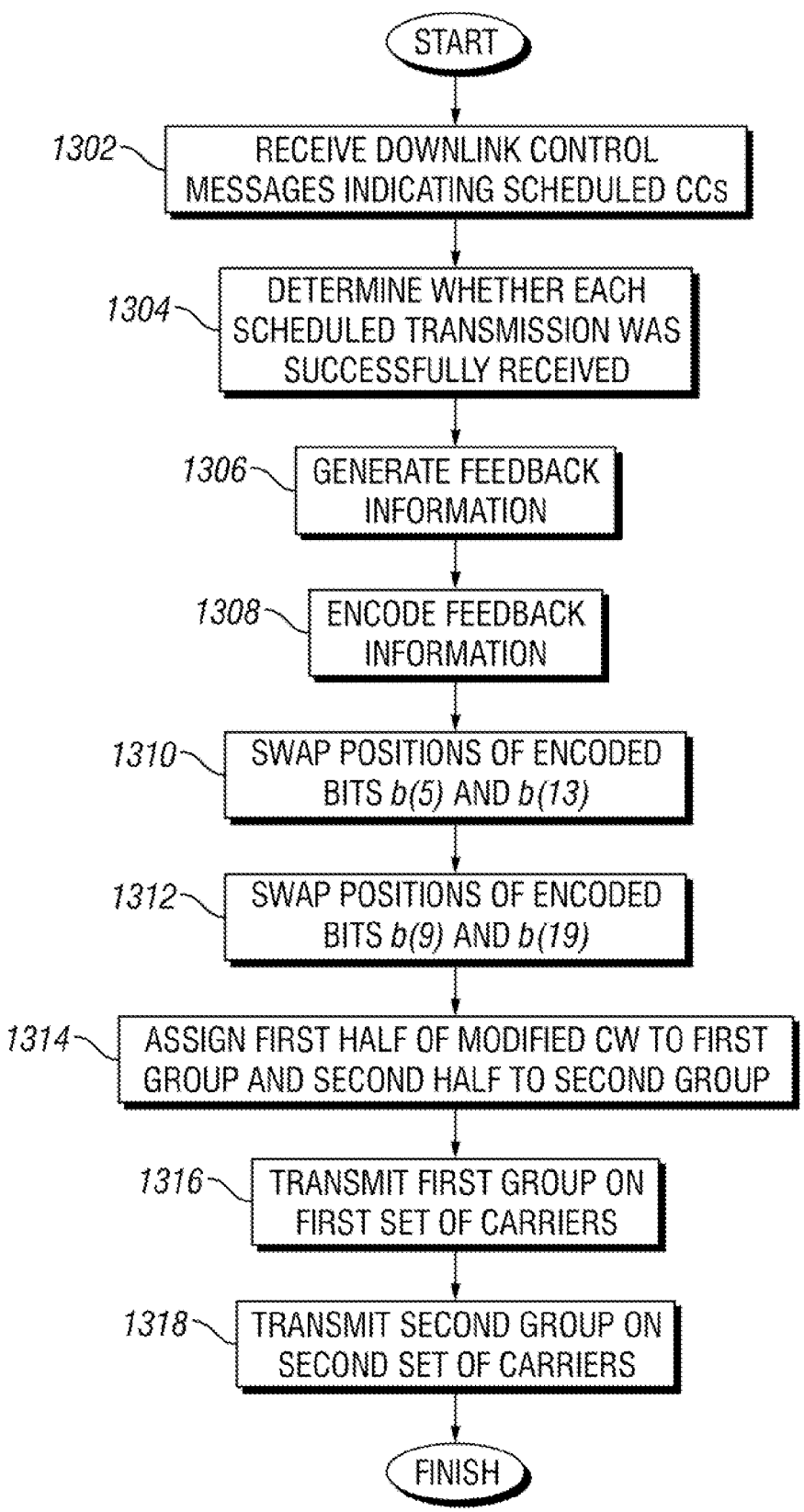
FIG. 13 is a flowchart illustrating example operation of the wireless terminal in transmitting control information using a first bit-swapping operation.

FIG. 13 is a flowchart illustrating example operation of a particular embodiment of wireless terminal 20 in using Bit Assignment I in transmitting feedback information over multiple different portions of carrier spectrum 100. In particular embodiments, wireless terminal 20 may receive scheduling information from an appropriate element of access network 30 (here assumed to be base station 32). Thus, in FIG. 13, the example operation starts with base station 32 transmitting to wireless terminal 20 one or more downlink control messages 70 scheduling component carriers for use by wireless terminal 20. As a result, at step 1302, wireless terminal 20 begins receiving downlink control messages 70 from base station 32, each downlink control message 70 indicating that wireless terminal 20 is scheduled to receive a downlink transmission on a particular component carrier (CC) during the subframe.

After sending the one or more downlink control messages 70 containing the scheduling information, base station 32 transmits the scheduled transmissions on the designated component carriers. Then, at an appropriate point in time after wireless terminal 20 was scheduled to receive these transmissions, wireless terminal 20 is expected to provide base station 32 with feedback information indicating whether wireless terminal 20 successfully received the scheduled transmissions. Thus, at step 1304, wireless terminal 20 determines whether wireless terminal 20 successfully received a transmission on each of the component carriers that the received downlink control messages 70 indicated wireless terminal 20 would.

At step 1306, wireless terminal 20 generates multiple bits of feedback information indicating whether a transmission was received on each of the scheduled component carriers. For example, in particular embodiments that implement LTE, wireless terminal 20 generates a set of HARQ feedback bits with one or more feedback bits associated with each component carrier that wireless terminal 20 is configured to monitor. Wireless terminal 20 may set the feedback bit(s) corresponding to a particular component carrier to "1" or "ACK" to indicate that wireless terminal 20 successfully received a scheduled transmission on the corresponding component carrier. Wireless terminal 20 may set the feedback bit(s) "0" or "NAK" to indicate that wireless terminal 20 did not successfully receive a scheduled transmission on the corresponding component carrier or did not successfully receive any scheduling information scheduling wireless terminal 20 for use of that component carrier during the subframe.

After generating the feedback information, wireless terminal 20 encodes the feedback information, at step 1308, using a block code that outputs an encoded bit sequence of a predetermined length. For example, in the illustrated embodiment of FIG. 13, the block code outputs an encoded bit sequence (denoted [b(0), b(1), . . . , b(19)]) that is 20 bits in length. Wireless terminal 20 divides the encoded bits into a first group and a second group, as shown by steps 1310-1314. Because the example illustrated by FIG. 13 implements Bit Assignment I, the first group in this example includes the encoded bits {b(0), b(1), b(2), b(3), b(4), b(6), b(7), b(8), b(13), b(19)}, and the second group includes the encoded bits {b(5), b(9), b(10), b(11), b(12), b(14), b(15), b(16), b(17), b(18)}. While wireless terminal 20 can achieve this assignment in any appropriate manner, in the illustrated example, wireless terminal 20 achieves the assignment, in part, by swapping the positions of encoded bit b(5) and encoded bit b(13), at step 1310, and swapping the positions of encoded bit b(9) and encoded bit b(19), at step 1312. At step 1314, wireless terminal 20 may then assign the encoded bits in the first half of the codeword (as modified by the bit-swapping) to a first group and those in the second half of the codeword to a second group.

Wireless terminal 20 then transmits the first group of encoded bits on a first set of carriers during a first slot of the relevant subframe at step 1316. For LTE, these carriers may represent a group of twelve (12) contiguous subcarriers located, for example, on an edge of carrier spectrum 100. At step 1318, wireless terminal 20 transmits the second group of encoded bits on a second set of carriers during the second slot of the sub frame. To achieve frequency-diversity gain in the transmission, wireless terminal 20 uses a second set of carriers that is different from the first set of carriers. In particular embodiments, the first set of carriers and the second set of carriers may be located on opposite edges of carrier spectrum 100. Operation of the example embodiment of wireless terminal 20 with respect to transmitting this feedback information may then end as shown in FIG. 13.

Figure 14:
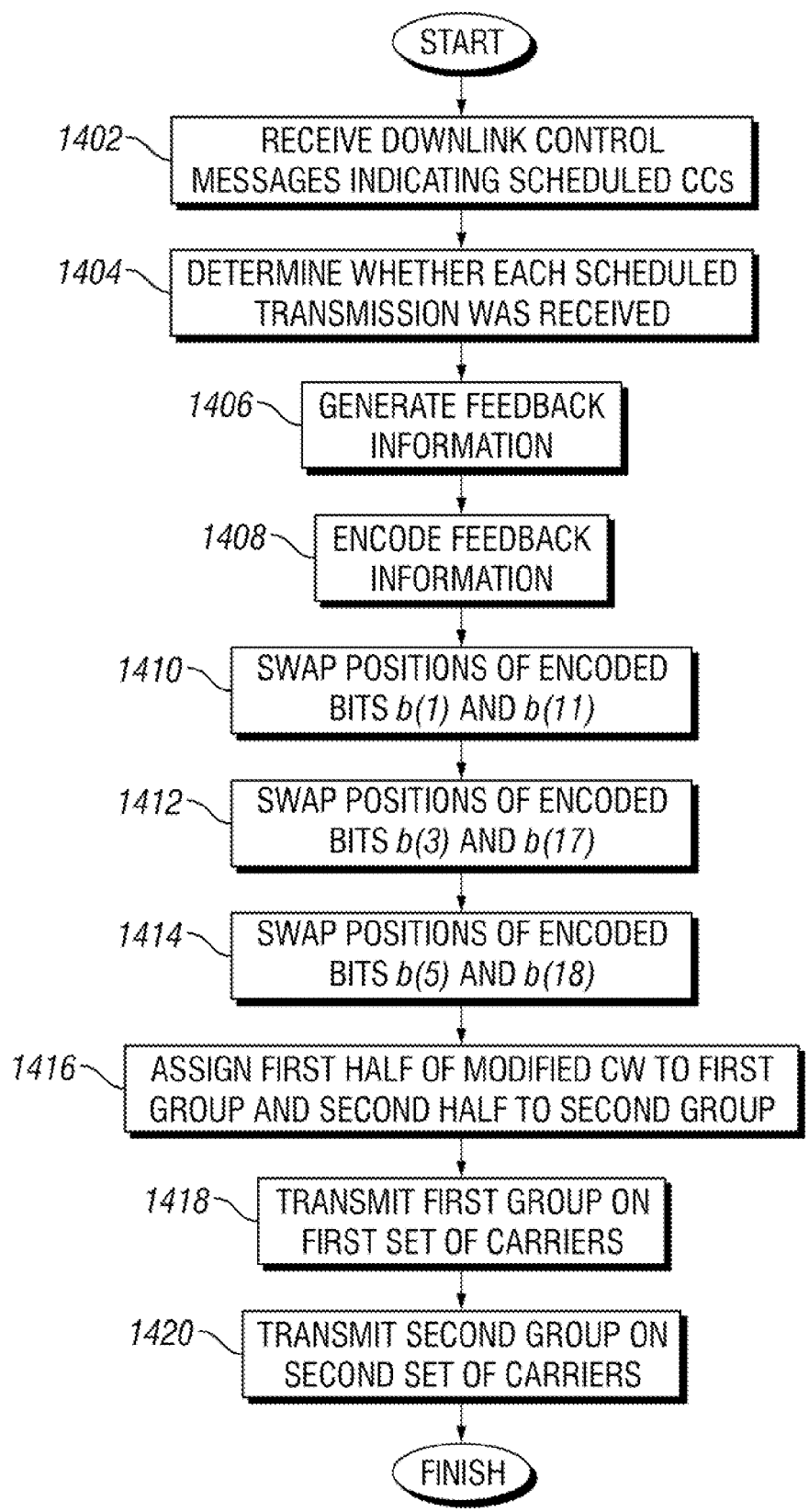
FIG. 14 is a flowchart illustrating example operation of the wireless terminal in transmitting control information using a second bit-swapping operation.

FIG. 14 is a flowchart illustrating example operation of an alternative embodiment of wireless terminal 20 that uses Bit Assignment II to transmit feedback information over multiple different portions 102 of carrier spectrum 100. Operation for the example embodiment described in FIG. 14 proceeds in an analogous fashion to that of FIG. 13 with similarly-captioned steps being performed in a similar manner to that described above with respect to FIG. 13. However, in steps 1410-1416, wireless terminal 20 divides the encoded bits into a first group and a second group. Because the example illustrated by FIG. 14 implements the Bit Assignment II scheme described above, the first group includes the encoded bits {b(0), b(2), b(4), b(6), b(7), b(8), b(9), b(11), b(17), b(18)}, and the second group includes the encoded bits {b(1), b(3), b(5), b(10), b(12), b(13), b(14), b(15), b(16), b(19)}. While wireless terminal 20 can achieve this assignment in any appropriate manner, in the illustrated example, wireless terminal 20 achieves the assignment, in part, by swapping the positions of encoded bit b(1) and encoded bit b(11), at step 1410, swapping the positions of encoded bit b(3) and encoded bit b(17), at step 1412, and swapping the positions of encoded bit b(5) and encoded bit b(18), at step 1414. At step 1416, wireless terminal 20 may then assign the encoded bits in the first half of the codeword (as modified by the bit-swapping) to a first group and those in the second half of the codeword to a second group.

Operation then proceeds again in an analogous manner to that described above with respect to FIG. 13. Operation of the example embodiment of wireless terminal 20 with respect to transmitting this feedback information may then end as shown in FIG. 14.

Figure 15:
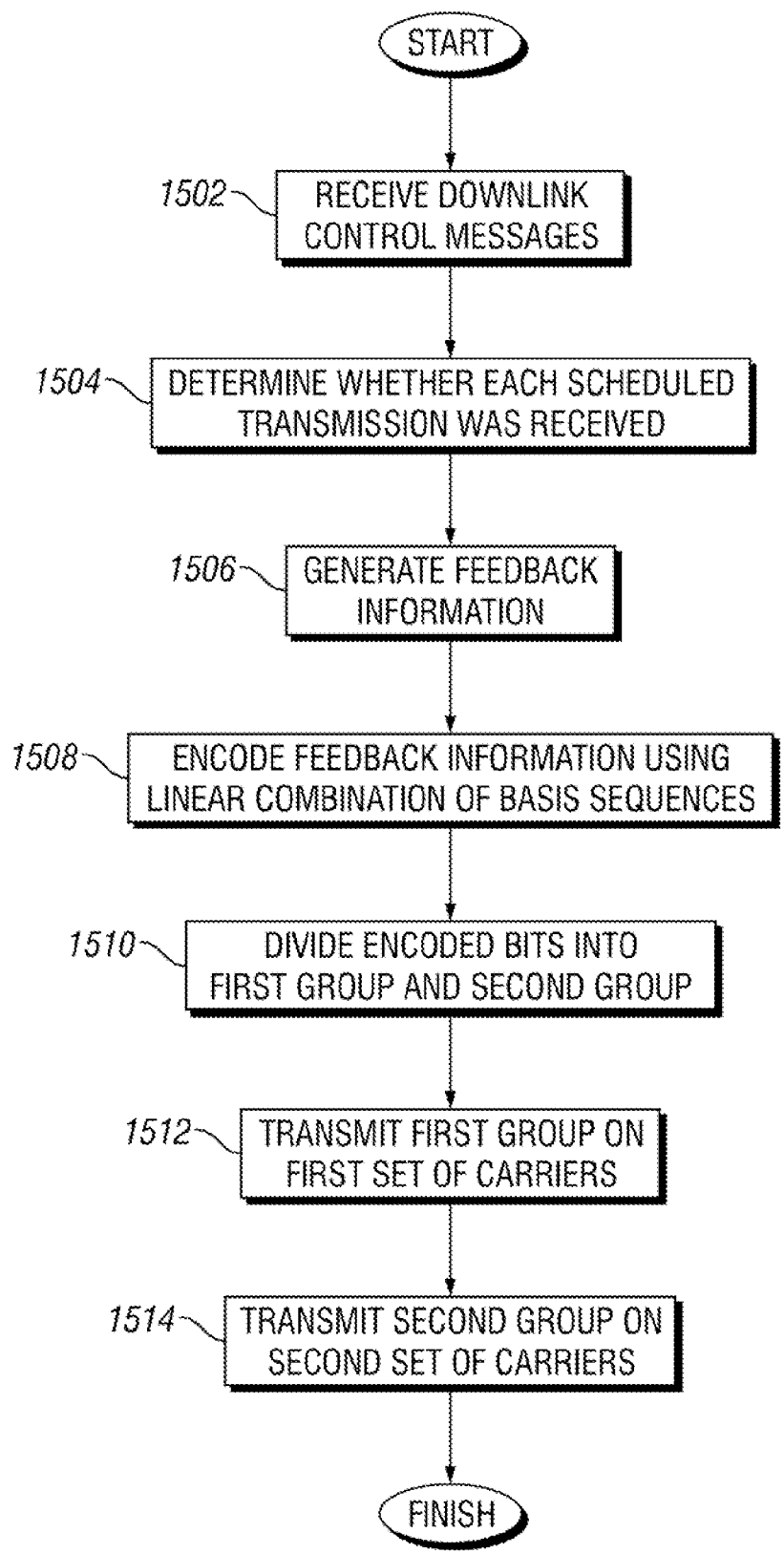
FIG. 15 is a flowchart illustrating example operation of the wireless terminal in transmitting control information using the basis sequences of FIG. 6B or 7B for encoding.

FIG. 15 is a flow chart illustrating example operation of a particular embodiment of wireless terminal 20 in encoding and transmitting control information using a set of basis sequences that have been designed to improve the frequency-diversity gain achieved by the resulting transmission. As explained above, particular embodiments of wireless terminal 20 may encode control information using a specific set of basis sequences that have been designed to improve the achieved frequency-diversity gain. These specialized basis sequences may be used as a supplement, or as an alternative, to any post-encoding bit-swapping.

Operation for the example embodiment described in FIG. 15 proceeds in a similar fashion to that of FIG. 13 with similarly-captioned steps being performed in a analogous manner to that described above with respect to FIG. 13. However, in the example operation of FIG. 15, wireless terminal 20 specifically encodes the feedback information using a block code that represents a linear combination of several basis sequences at step 1508. In particular embodiments, these thirteen basis sequences each have a length of twenty-bits. Additionally, to improve the frequency-diversity gain achieved by the encoding, each of the basis sequences has a non-zero value in at least one of its first ten bits and a non-zero value in at least one of its last ten bits. Furthermore, unlike the reduced set of basis sequences shown in FIG. 3, the basis sequences utilized by the illustrated embodiment include a full complement of thirteen basis sequences. As a result, the information carrying capacity of the feedback bits is not reduced (as is the case when using the reduced set of basis sequences described by FIG. 3). In embodiments of wireless terminal 20 that implement Bit Assignment I, wireless terminal 20 may use the thirteen basis sequences shown in FIG. 6B for this encoding. In embodiments of wireless terminal 20 that implement Bit Assignment II, wireless terminal 20 may use the thirteen basis sequences shown in FIG. 7B for this encoding.

After encoding the bits, wireless terminal 20 divides the encoded bits into at least a first group and a second group at step 1510. As part of this assignment process, wireless terminal 20 may perform interleaving or other forms of bit-swapping to optimize the assignment of bits to transmission slots. Nonetheless, in particular embodiments, wireless terminal 20 may be able to achieve an improved assignment or bits to slots/carriers by using the modified basis sequences without any additional bit swapping after encoding. Thus, in such embodiments, wireless terminal 20 may maintain the bit order of the codeword in dividing the encoded bits into the first and second groups, thereby reducing the computational complexity of the assignment process.

At step 1512, wireless terminal 20 transmits the first group of encoded bits to base station 32 on a first set of carriers during the first slot of the relevant subframe. For LTE, this first set of carriers may represent a group of twelve (12) contiguous subcarriers located on one edge of carrier spectrum 100. Wireless terminal 20 then transmits the second group of encoded bits to base station on a second set of carriers during the second slot of the relevant subframe at step 1514. To achieve frequency-diversity gain in the transmission, the second set of carriers is different from the first set of carriers. In particular embodiments, the first set of carriers and the second set of carriers may be located on opposite edges of carrier spectrum 100. Operation of the example embodiment of wireless terminal 20 with respect to transmitting this feedback information may then end as shown in FIG. 15.

Figure 16:
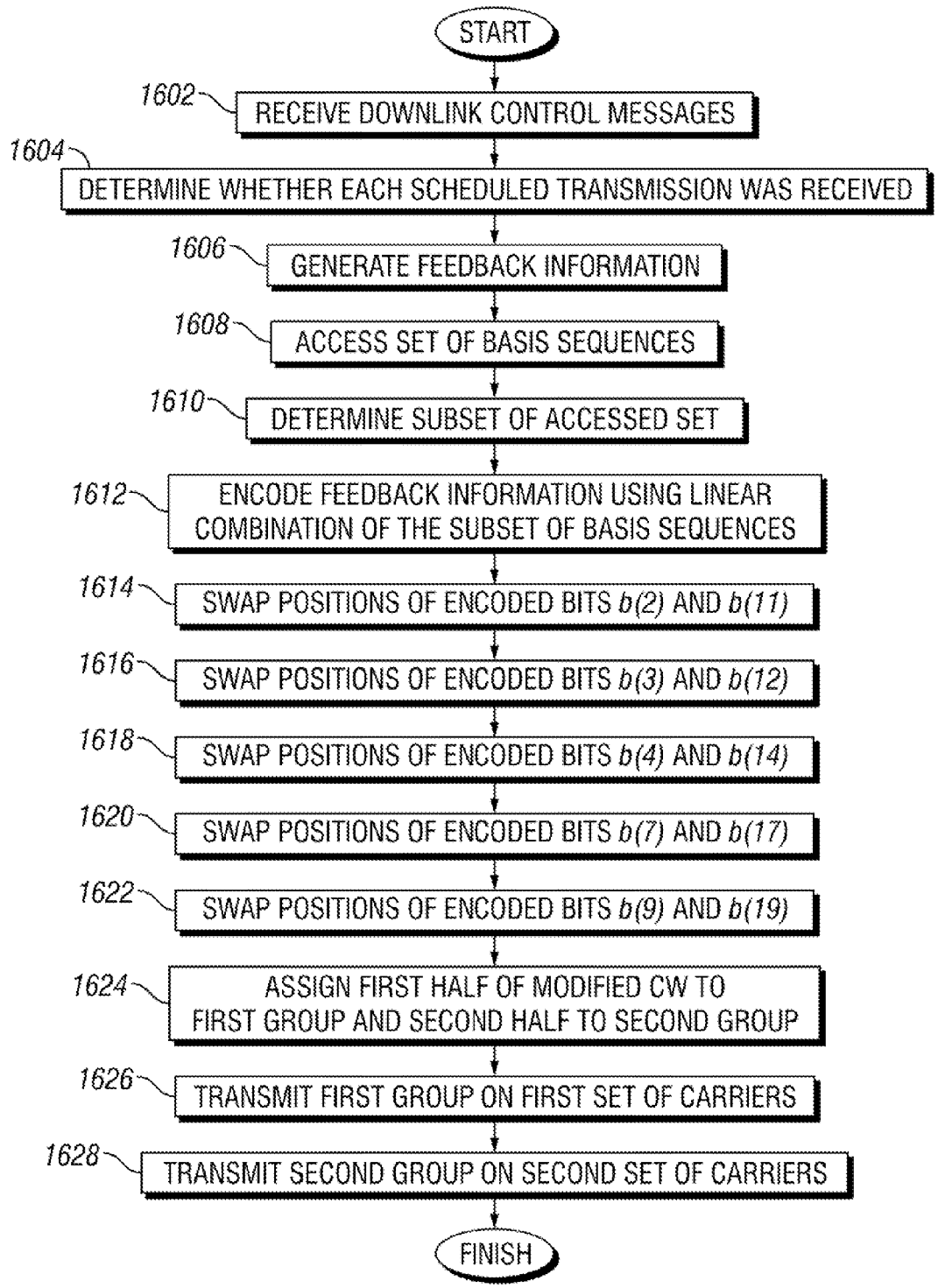
FIG. 16 is a flowchart illustrating example operation of the wireless terminal in transmitting control information using the basis sequences of FIG. 3 and a third bit-swapping operation.

FIG. 16 is a flowchart illustrating example operation of a particular embodiment of wireless terminal 20 in encoding and transmitting control information using a set of basis sequences that have been modified to improve the frequency-diversity gain achieved by the resulting transmission. As noted above, particular embodiments of wireless terminal 20 may be configured to use a reduced set of basis sequences created by removing select basis sequences from a larger set of basis sequences. More specifically, basis sequences that do not affect both the first half and the second half of the resulting codeword are removed from the larger set. While removing basis sequences in this manner may improve the frequency-diversity gain achieved for control information of certain sizes, it still may not provide an optimal frequency-diversity gain for all control information sizes. As a result, particular embodiments of wireless terminal 20 may be configured to implement certain bit-swapping techniques after encoding feedback information with a set of basis sequences reduced in this manner. FIG. 16 illustrates example operation for such an embodiment.

Operation for the example embodiment described in FIG. 16 proceeds in an analogous fashion to that of FIG. 13 with similarly-captioned steps being performed in a similar manner to that described above with respect to FIG. 13. However, in the example operation of FIG. 16, wireless terminal 20 encodes the feedback information using a set of basis sequences from which basis sequences that do not have any non-zero values in their first half and basis sequences that do not have any non-zero values in their second half have been removed. Wireless terminal 20 may obtain this reduced set of basis sequences in any suitable manner depending on its configuration. For example, in particular embodiments, wireless terminal 20 may be programmed with the reduced set and may not possess a copy of the full set of basis sequences or any of the basis sequences that were removed from the larger set.

In alternative embodiments, however, wireless terminal 20 may be configured to generate the reduced set of basis sequences from the larger set during operation. An example of how particular embodiments of wireless terminal 20 may perform this operation is shown in steps 1608-1610. Specifically, wireless terminal 20 accesses a set of basis sequences at step 1608. Wireless terminal 20 may access this set by receiving the set from another device (such as base station 32), accepting the set as input from a user, reading the set from memory, or accessing the set in any other appropriate manner. At step 1610, wireless terminal 20 determines a subset of the accessed set that includes only those basis sequences in the accessed set having at least one non-zero value in their first ten bits and at least one non-zero value in their second ten bits. Furthermore, wireless terminal 20 can determine the subset in any suitable manner. For instance, wireless terminal 20 might determine the subset by reading each of the basis sequences in the set from memory and determining whether it satisfied the appropriate criteria, or wireless terminal 20 might determine the subset by reading only a predetermined group of the basis sequences from memory. As a specific example, in embodiments or wireless terminal 20 that utilize the basis sequences shown in FIG. 2 for the original set, wireless terminal 20 may be configured with indices for the basis sequences to be included in the subset and, based on this information, wireless terminal 20 may determine the subset by reading all of the relevant basis sequences from memory. By doing so in this example, wireless terminal 20 forms a subset that includes all of the basis sequences in the original set except $M_{i,5}$ (as shown by FIG. 3).

After determining the appropriate subset of basis sequences to use, wireless terminal 20 encodes the feedback information using a block code that represents a linear combination of the subset of basis sequences, at step 1612. For the illustrated example, wireless terminal 20 encodes the feedback by generating a linear combination of the subset of basis sequences in accordance with Equation (1) to produce a codeword comprising twenty encoded bits (b(0), b(1), . . . , b(19)). Wireless terminal 20 then divides the encoded bits of the resulting codeword into a first group and a second group. The first group includes the encoded bits {b(0), b(1), b(5), b(6), b(8), b(11), b(12), b(14), b(17), b(19)}, and the second group includes the encoded bits {b(2), b(3), b(4), b(7), b(9), b(10), b(13), b(15), b(16), b(18)}. While wireless terminal 20 can achieve this assignment in any appropriate manner, in the illustrated example, wireless terminal 20 achieves the assignment by swapping the positions of encoded bit b(2) and encoded bit b(11), at step 1614; swapping the positions of encoded bit b(3) and encoded bit b(12), at step 1616; swapping the positions of encoded bit b(4) and encoded bit b(14), at step 1618; swapping the positions of encoded bit b(7) and encoded bit b(17), at step 1620, and swapping the positions of encoded bit b(9) and encoded bit b(19), at step 1622. At step 1624, wireless terminal 20 may then assign the encoded bits in the first half of the codeword (as modified by the bit-swapping) to a first group and those in the second half of the codeword to a second group.

Once the encoded bits have been assigned to the first and second group, the operation of the described embodiment proceeds in an analogous fashion to that described by FIG. 13. Operation of wireless terminal 20 with respect to transmitting the feedback information may then end as shown in FIG. 16B.

Figure 17:
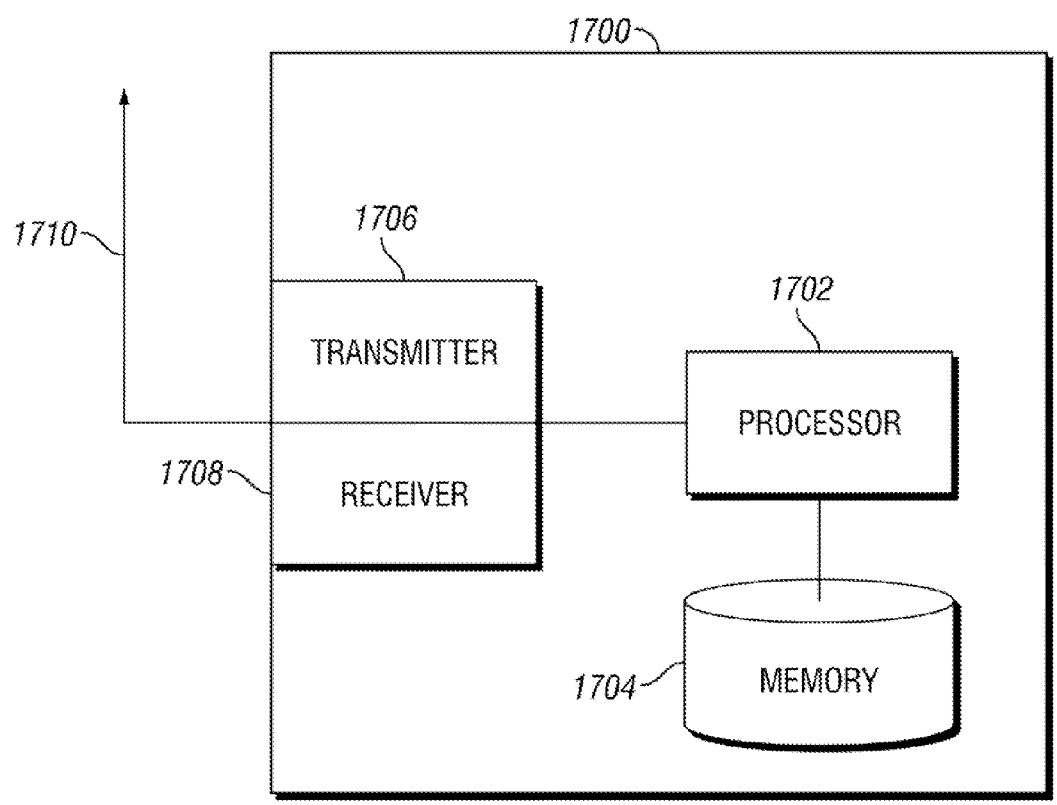
FIG. 17 is a block diagram showing the contents of a particular embodiment of a network capable of receiving control information.

FIG. 17 is a structural block diagram showing the contents of a network node 1700 that may serve as a receiver for control information transmitted by wireless terminal 20 or other devices using the techniques described above. For example, in particular embodiments, network node 1700 may represent an element of a radio access network that receives uplink transmissions from wireless terminal 20 (such as base station 32 in FIG. 11). As shown in FIG. 17, the illustrated embodiment of network node 1700 includes a processor 1702, a memory 1704, a transmitter 1706, a receiver 1708, and one or more antennas 1710. Processor 1702, memory 1704, transmitter 1706, receiver 1708, and antenna 1710 may represent identical or analogous elements to the similarly-named elements of FIG. 12. In particular embodiments of network node 1700, some or all of the functionality of network node 1700 described below with respect to FIGS. 18-21 may be implemented by processor 1702 executing instructions and/or operating in accordance with its hardwired logic.

Figure 18:
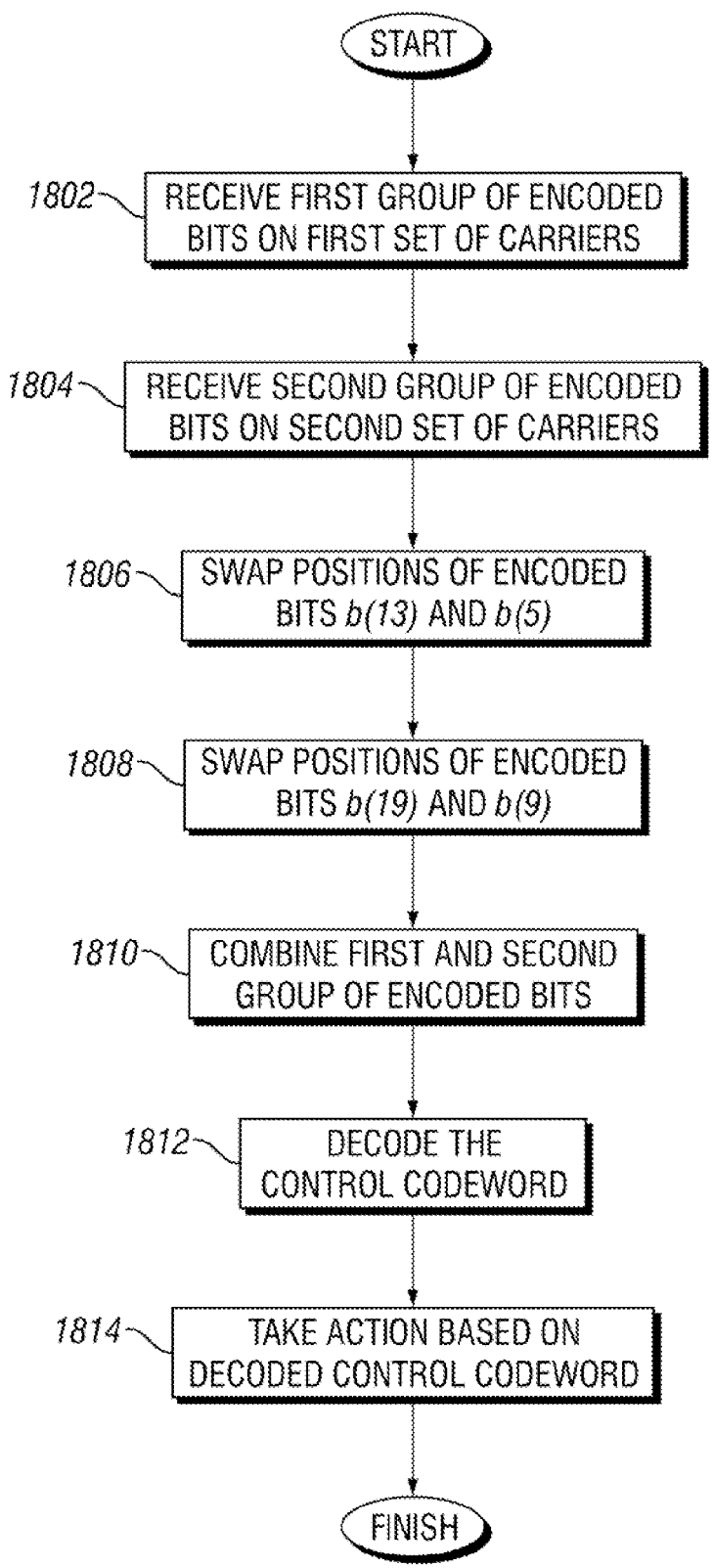
FIG. 18 is a flowchart illustrating example operation of the network node in receiving and processing control information to which a first bit-swapping operation has been applied.

FIG. 18 is a flowchart illustrating example operation of a particular embodiment of network node 1700 in receiving control information that has been processed using Bit Assignment I and transmitted over multiple different portions of carrier spectrum 100. In particular embodiments, wireless terminal 20 may transmit control information to network node 1700 using an uplink control message 72 that carries a control codeword containing encoded control information. In such embodiments, wireless terminal 20 may transmit a first group of bits from the control codeword over a first set of carriers and a second group of bits from the control codeword over a second set of carriers. Thus, in the example illustrated by FIG. 18, operation begins with network node 1700 receiving a first group of encoded bits on a first set of carriers at step 1802. Network node 1700 then receives a second group of encoded bits on a second set of carriers at step 1804. In certain embodiments, the first set of carriers have different frequencies from the second set of carriers.

After receiving the first group and second group of bits, network node 1700 reorders and combines the bits of the first and second groups to reconstruct the original control codeword as shown by steps 1806-1810 in FIG. 18. As noted above, the bits in each of the groups may be transmitted in any order. In particular embodiments, this order is predetermined and known by both network node 1700 and wireless terminal 20. As a result, network node 1700 may reorder the bits in the first group and second group based on this predetermined order and combine the two groups, either before or after reordering the bits, to obtain the original control codeword. For the example of FIG. 18, wireless terminal 20 is assumed to have implemented Bit Assignment I in assigning the bits of encoded control information to the first group and the second group. Additionally, for this example, wireless terminal 20 is assumed to have encoded the control information using the LTE (20, A) block code. Thus, the first group of bits includes bits {b(0), b(1), b(2), b(3), b(4), b(6), b(7), b(8), b(13), b(19)} of a twenty-bit control codeword and the second group includes bits {b(5), b(9), b(10), b(11), b(12), b(14), b(15), b(16), b(17), b(18)} of the same control codeword.

While the predetermined order may represent any suitable order for the bits of the first group and the second group, in particular embodiments, wireless terminal 20 uses a bit swapping procedure to swap the bits of the control codeword before assigning the first half of the bit-swapped control codeword to the first group and the second half to the second group. As a result, in particular embodiments, network node 1700 reorders the bits of the first and second group by reversing the bit swapping performed by wireless terminal 20. For example, as described above with respect to FIG. 13, particular embodiments of wireless terminal 20 may swap the positions of encoded bit b(5) and encoded bit b(13) and swap the positions of encoded bit b(9) and encoded bit b(19). Thus, at step 1806, network node 1700 may use knowledge of a predetermined order of the respective bits in the first group and the second group to swap a position of encoded bit b(13) in the first group with a position of encoded bit b(5) in the second group. Furthermore, wireless terminal 20 transmits the first group in the order of the original control codeword apart from the bit-swapped bits of the control codeword. Thus, in such embodiments, network node 1700 receives the first group in the order {b(0), b(1), b(2), b(3), b(4), b(13), b(6), b(7), b(8), b(19)} and the second group in the order {b(10), b(11), b(12), b(5), b(14), b(15), b(16), b(17), b(18), b(9)}. Consequently, in particular embodiments, the bit-swapping described for step 1806 may involve swapping the sixth bit in the first group of encoded bits received from wireless terminal 20 with the fourth bit in the second group of encoded bits received.

Similarly, at step 1808, network node 1700 may use knowledge of a predetermined order of the respective bits in the first group and the second group to swap a position of the original control codeword's bit b(19) in the first group of encoded bits received from wireless terminal 20 and a position of the original control codeword's bit b(9) in the second group of encoded bits. If wireless terminal 20 transmitted the bits of the original control codeword in order (apart from the bit-swapped bits), the bit-swapping of step 1808 may involve swapping the tenth bit of the first group of encoded bits received from wireless terminal 20 with the tenth bit in the second group of encoded bits received.

Before or after performing the bit swapping of steps 1806 and 1808, network node 1700 combines the first group of encoded bits and the second group of encoded bits, as shown at step 1810. The reordering and combining completed by network node 1700 should recreate the original codeword generated by wireless terminal 20.

Thus, once network node 1700 completes the reordering and combining, network node 1700, at step 1812, decodes the control codeword produced by the reordering and combining. Network node 1700 may then take appropriate action in response to the decoded control information. For example, if the control codeword represents encoded feedback bits (e.g., HARQ feedback bits), network node 1700 may determine based on the decoded feedback bits and other appropriate considerations whether to retransmit a scheduled transmission previously transmitted to wireless terminal 20. If the control codeword represents encoded channel status information, network node 1700 may use the channel status information in setting parameters for subsequent transmissions to wireless terminal. Operation of network node 1700 may then end with respect to receiving the control information as shown in FIG. 18.

Figure 19:
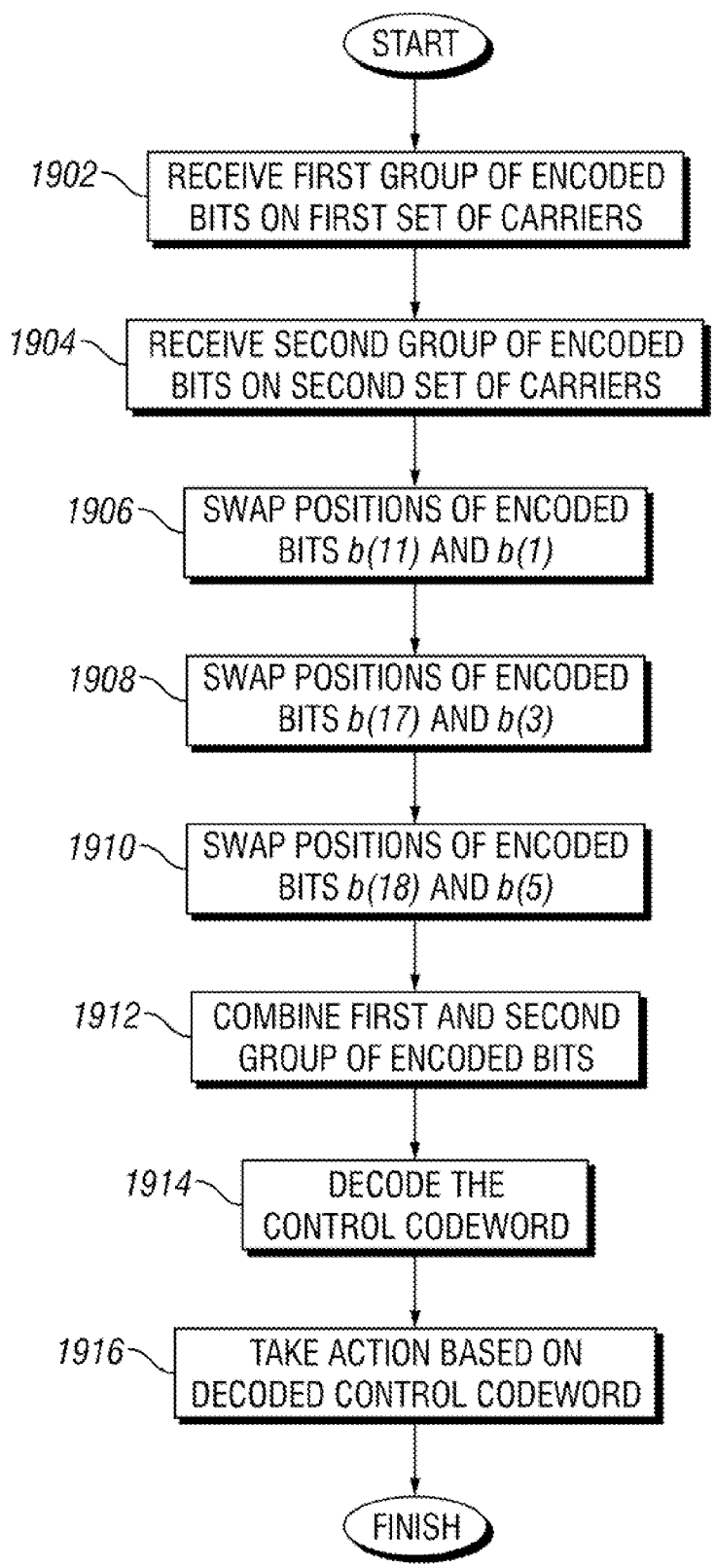
FIG. 19 is a flowchart illustrating example operation of the network node in receiving and processing control information to which a second bit-swapping operation has been applied.

FIG. 19 is a flowchart illustrating example operation of an alternative embodiment of network node 1700 in receiving control information that has been processed using Bit Assignment II. Operation for the example embodiment described in FIG. 19 proceeds in an analogous fashion to that of FIG. 18 with similarly-captioned steps being performed in a similar manner to that described above with respect to FIG. 18. However, for the example illustrated by FIG. 19, wireless terminal 20 uses the bit swapping technique described above with respect to the Bit Assignment II scheme to assign the bits of the original codeword to the first group and the second group. That is, wireless terminal 20 swaps the positions of bits b(1) and b(11), swaps the positions of bits b(3) and b(17), and swaps the positions of bits b(5) and b(18). The illustrated example assumes that wireless terminal 20 then transmits the first half of the bit-swapped codeword in the first group of bits and the second half of the bit-swapped codeword in the second group of bits. Thus, at steps 1902 and 1904, network node 1700 receives a first group of bits that includes bits {b(0), b(2), b(4), b(6), b(7), b(8), b(9), b(11), b(17), b(18)} of the original control codeword and a second group of bits that includes {b(1), b(3), b(5), b(10), b(12), b(13), b(14), b(15), b(16), b(19)}.

Network node 1700 may then reorder and combine the bits of the first and second groups to reconstruct the original control codeword as shown by steps 1906-1912 in FIG. 19. In doing so, network node 1700 may reverse bit swapping performed by wireless terminal 20. For this example embodiment, network node 1700 swaps the positions of encoded bits b(11) and b(1) at step 1906, swaps the positions of bits b(17) and b(3) at step 1908, and swaps the positions of encoded bits b(18) and b(5) at step 1910. As with the example of FIG. 18, particular embodiments of network node 1700 may use knowledge of the predetermined order in which wireless terminal 20 has transmitted the first and the second group of bits to perform this swapping. In particular embodiments, wireless terminal 20 transmits the first half and the second half of the bit-swapped control codeword in order. Thus, in such embodiments, network node 1700 receives the bits of the first group in the order {b(0), b(11), b(2), b(17), b(4), b(18), b(6), b(7), b(8), b(9)} and the bits of the second group in the order {b(10), b(1), b(12), b(13), b(14), b(15), b(16), b(3), b(5), b(19)}. Consequently, for such embodiments, network node may perform the bit swap of step 1906 by swapping the second bit in the first group of received bits with the second bit in the second group of received bits, the bit swap of step 1908 by swapping the fourth bit of the first group with the eighth bit of the second group, and the bit swap of step 1910 by swapping the sixth bit of the first group with the ninth bit of the second group.

Before or after reordering the first group of received bits and the second group of received bits, network node 1700 may combine the first group and the second group as shown at step 1912. Operation may proceed in a similar fashion to that described with respect to the corresponding steps of FIG. 18. Operation of network node 1700 may then end with respect to receiving the control information as shown in FIG. 19.

Figure 20:
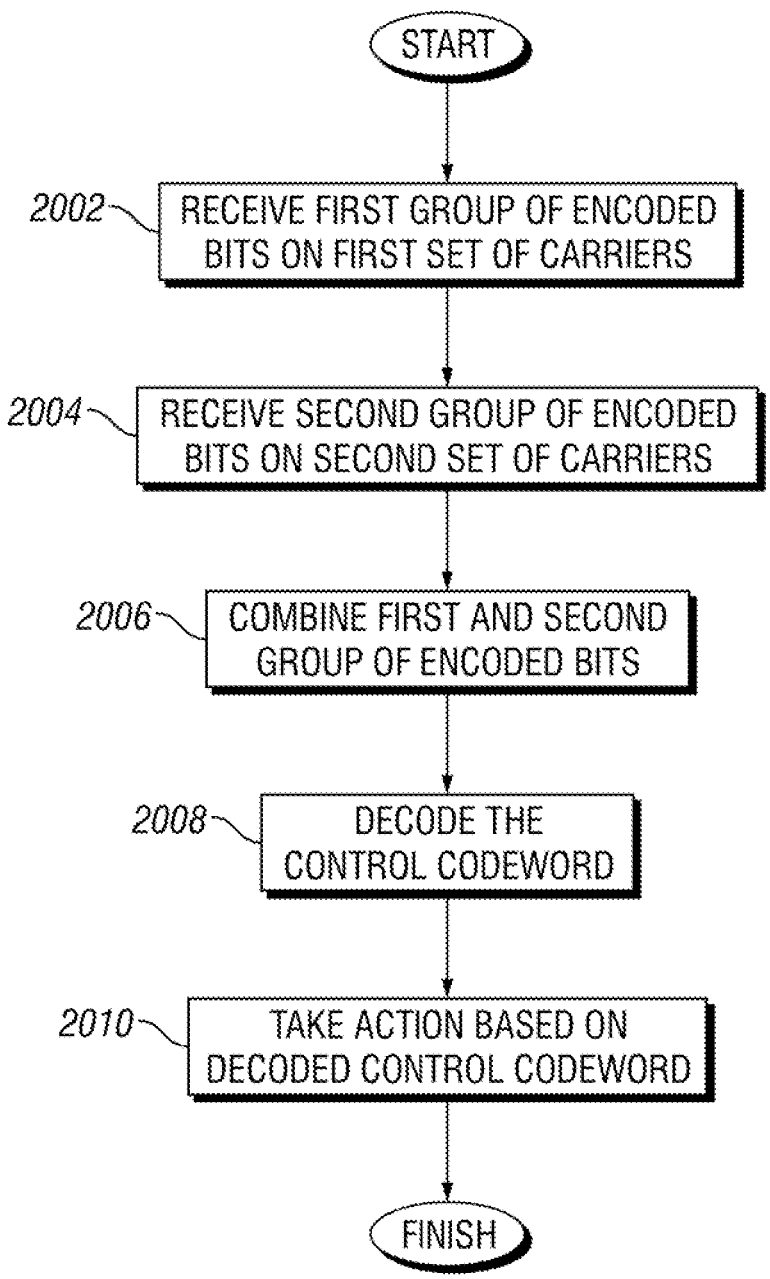
FIG. 20 is a flowchart illustrating example operation of the network node in receiving and processing control information encoded using the basis sequences of FIG. 6B or 7B.

FIG. 20 is a flow chart illustrating example operation of a particular embodiment of network node 1700 in receiving and decoding control information using a set of basis sequences that have been designed to improve the frequency-diversity gain achieved in transmitting the control information. As explained above, particular embodiments of wireless terminal 20 may encode control information using a specific set of basis sequences that have been designed to improve the achieved frequency-diversity gain. These specialized basis sequences may be used as a supplement, or as an alternative, to any post-encoding bit-swapping. Network node 1700 may be configured to decode the resulting codewords when received from wireless terminal 20 using the same or similar basis sequences.

Operation for the example embodiment described in FIG. 20 begins at step 2002 with network node 1700 receiving a first group of encoded bits on a first set of carriers. Network node 1700 then receives a second group of encoded bits on a second set of carriers at step 2004. In certain embodiments, the second set of carriers have different frequencies from the first set of carriers.

At step 2006, network node 1700 combines the first and second group of encoded bits to reconstruct the original codeword generated by wireless terminal 20. Although particular embodiments of network node 1700 may be configured to use the relevant set of basis sequences to eliminate the need for additional bit-swapping, alternative embodiments of network node 1700 may be configured, as part of reconstructing the original control codeword, to perform bit-swapping or otherwise reorder the bits of the first and the second group before or after combining the groups.

Once network node 1700 has reconstructed the control codeword, network node 1700 decodes the control codeword at step 2008. In particular, network node 1700 decodes the received control codeword using a set of thirteen basis sequences that are the same or similar to basis sequences used by wireless terminal 20 in encoding the original control information. In particular embodiments, these thirteen basis sequences each have a length of twenty-bits. Additionally, to improve the frequency-diversity gain achieved by the encoding, each of the basis sequences has a non-zero value in at least one of its first ten bits and a non-zero value in at least one of its last ten bits. Furthermore, unlike the reduced set of basis sequences shown in FIG. 3, the basis sequences utilized by the illustrated embodiment include a full complement of thirteen basis sequences. As a result, the information carrying capacity of the control information bits has not been reduced (as would be the case if the reduced set of basis sequences described by FIG. 3 were used). In embodiments of network node 1700 that receive control information from wireless terminals 20 that implement Bit Assignment I, network node 1700 may use the thirteen basis sequences shown in FIG. 6B for this decoding. In embodiments of network node 1700 that receive control information from wireless terminals 20 that implement Bit Assignment II, network node 1700 may use the thirteen basis sequences shown in FIG. 7B for this decoding.

Operation may then proceed in a similar fashion to that described with respect to the corresponding steps of FIG. 18. Operation of network node 1700 may then end with respect to receiving the control information as shown in FIG. 20.

Figure 21:
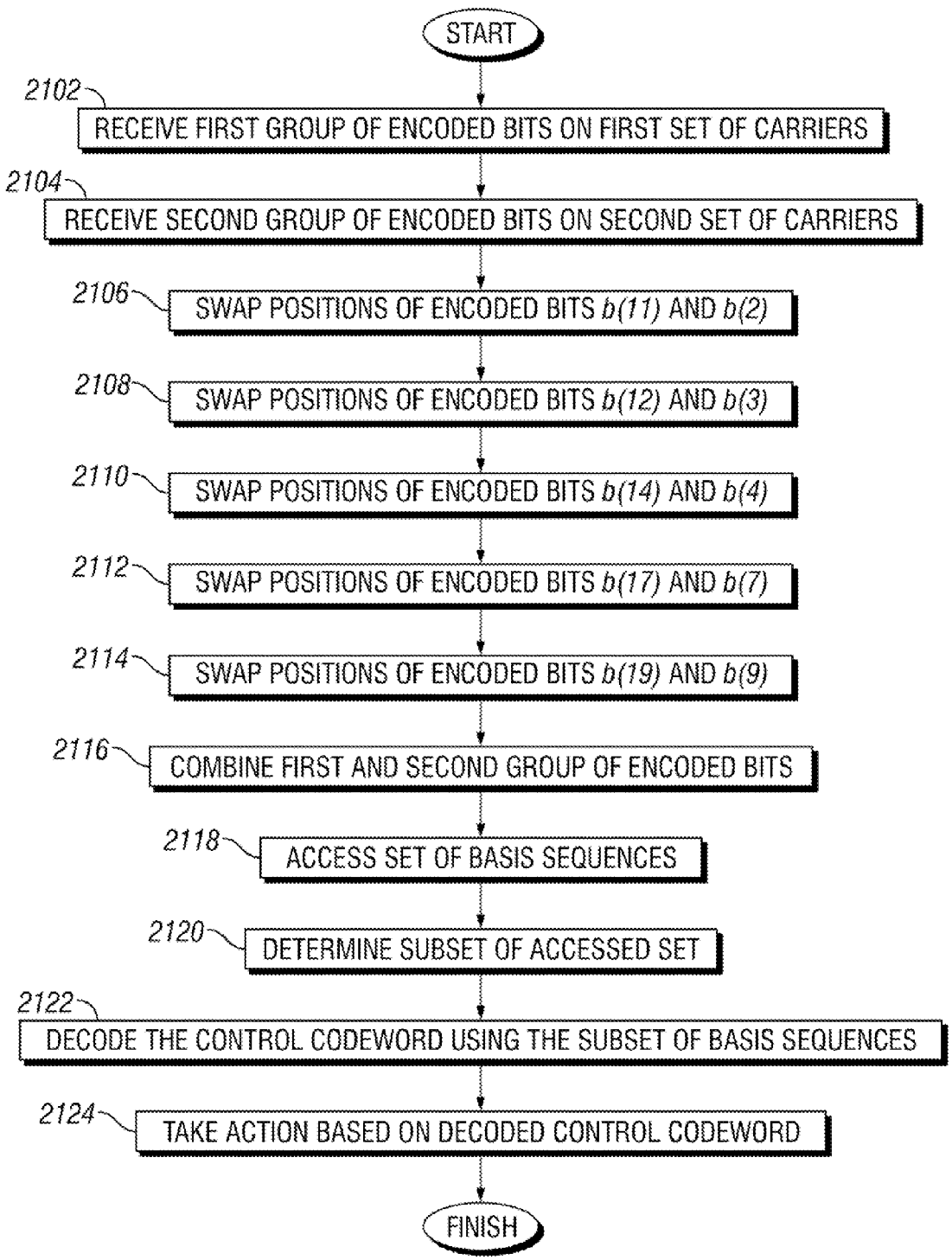
FIG. 21 is a flowchart illustrating example operation of the network node in receiving and processing control information that has been encoded using the basis sequences of FIG. 3 and a third bit-swapping operation.

FIG. 21 is a flowchart illustrating example operation of a particular embodiment of network node 1700 in receiving and decoding control information using a set of basis sequences that have been modified to improve the frequency-diversity gain achieved by the resulting transmission. As noted above, particular embodiments of wireless terminal 20 may be configured to use a reduced set of basis sequences created by removing select basis sequences from a larger set of basis sequences. More specifically, basis sequences that do not affect both the first half and the second half of the resulting codeword are removed from the larger set to achieve improved frequency diversity. Particular embodiments of wireless terminal 20 may be configured to implement certain bit-swapping techniques after encoding control information with a set of basis sequences reduced in this manner. Consequently, particular embodiment of network node 1700 may be configured to perform corresponding processing on the receiving end to properly decode control information transmitted by such wireless terminals 20. FIG. 21 illustrate example operation for such an embodiment of network node 1700.

For the example illustrated by FIG. 21, wireless terminal 20 is assumed to have encoded the received control information using a set of basis sequences from which any basis sequences that do not have any non-zero values in their first half and basis sequences that do not have any non-zero values in their second half have been removed. Additionally, wireless terminal is assumed to have regrouped the bits of the resulting control codeword to further improve the frequency diversity achieved by the transmission. In the example, wireless terminal 20 is assumed to have divided the bits of the control codeword into a first group that includes the first half of the codeword and a second group that includes the second half of the codeword, and exchanged certain bits between the resulting groups. In particular, wireless terminal 20 is assumed to have swapped the positions of encoded bits b(2) and b(11), the positions of encoded bits b(3) and b(12), the positions of encoded bits b(4) and b(14), the positions of encoded bits b(7) and b(17), and the positions of encoded bits b(9) and b(19). The bit-swapped groups of bits were then transmitted by wireless terminal 20. Thus, operation begins in FIG. 21 with network node 1700 receiving a first group of encoded bits at step 2102 and a second group of encode bits at step 2104. In this example, the first group includes the original control codeword's bits {b(0), b(1), b(5), b(6), b(8), b(11), b(12), (14), b(17), b(19)} from the original twenty-bit control codeword and the second group includes the bits {b(2), b(3), b(4), b(7), b(9), b(10), b(13), b(15), b(16), b(18)}.

In steps 2106-2116, network node 1700 reorders and combines the bits of the first group and the second group to reconstruct the original control codeword generated by wireless terminal 20. In doing so, network node 1700 reverses the bit swapping performed by wireless terminal 20. As a result, for this example embodiment, network node 1700 swaps the positions of bits b(11) and b(2) at step 2106, swaps the positions of bits b(12) and b(3) at step 2108, swaps the positions of bits b(14) and b(4) at step 2110, swaps the positions of encoded bits b(17) and b(7) at step 2112, and swaps the positions of bits b(19) and b(9) at step 2114.

Furthermore, as explained above, wireless terminal 20 may transmit the bits in the first group and the second group in any appropriate order. Thus, in particular embodiments, network node 1700 may use knowledge of a predetermined order used by wireless terminal 20 for the first group and the second group to return the encoded bits to the original order of the control codeword. For example, in particular embodiments, wireless terminal 20 may transmit the bits in the first half of the bit-swapped control codeword in order (apart from the bit-swapping) as the first group and the bits in the second half of the bit-swapped control codeword in order (apart from the bit-swapping) as the second group. Thus, in such embodiments, network node 1700 receives the bits of the first group in the order {b(0), b(1), b(11), b(12), b(14), b(5), b(6), b(17), b(8), b(19)} and the bits of the second group in the order {b(10), b(2), b(3), b(13), b(4), b(15), b(16), b(7), b(18), b(9)}. Consequently, for such embodiments, network node 1700 may perform the bit swap of step 2106 by swapping the third bit of the first group of received bits with the second bit of the second group of received bits, the bit swap of step 2108 by swapping the fourth bit of the first group with the third bit of the second group, the bit swap of step 2110 by swapping the fifth bit of the first group with the fifth bit of the second group, the bit swap of step 2112 by swapping the eighth bit of the first group with the eighth bit of the second group, and the bit swap of step 2114 by swapping the tenth bit of the first group with the tenth bit of the second group.

Before or after performing the bit swap of steps 2106-2114, network node 1700 combines the first group of encoded bits and the second group of encoded bits as shown at step 2116. The reordering and combining completed by network node 1700 should recreate the original codeword generated by wireless terminal 20. Thus, once network node 1700 completes the reordering and combining, network node 1700 decodes the control codeword produced by the reordering and combining.

Network node 1700 may use the same or a similar set of basis sequences to decode the received control information as wireless terminal 20 used for encoding. As explained for wireless terminal 20 in connection with FIG. 16 above, network node 1700 may obtain this reduced set of basis sequences in any suitable manner depending on its configuration. As one example, network node 1700 may obtain the reduced set of basis sequences as shown by steps 2118-2120, operating in an analogous fashion to that described above with respect to similarly captioned steps of FIG. 16. After obtaining the reduced set of basis sequences, network node 1700 may decode the reconstructed control codeword at step 2122 using the reduced set of basis sequences. Operation may then proceed in a similar fashion to that described with respect to the corresponding steps of FIG. 18. Operation of network node 1700 may then end with respect to receiving the control information as shown in FIG. 21.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims. For example, although the discussion above focuses for the sake of illustration on embodiments in which a wireless terminal uses the described techniques to transmit control information in the uplink direction and a network node uses the described techniques to received and decode the control information, alternative embodiments may implement the described techniques in the downlink direction with a base station or other network node using the described techniques to encode and transmit control information and a wireless terminal using the described techniques to receive and decode control information.

What is claimed is:
1. A method of decoding a control codeword that comprises encoded bits b(0), b(1), . . . , b(19), the method comprising:
   receiving, on a first set of carriers, a first group of the encoded bits from the control codeword, wherein the first group includes bits {b(0), b(1), b(5), b(6), b(8), b(11), b(12), b(14), b(17), b(19)} of the control codeword;
   receiving, on a second set of carriers, a second group of the encoded bits from the control codeword, wherein the second group includes bits {b(2), b(3), b(4), b(7), b(9), b(10), b(13), b(15), b(16), b(18)} of the control codeword and wherein the second set of carriers have different frequencies from the first set of carriers;
   reconstructing the control codeword from the first group of encoded bits and the second group of encoded bits by:
      reordering the first group of encoded bits and the second group of encoded bits; and
      combining the first group of encoded bits and the second group of encoded bits; and
   decoding the control codeword using a plurality of basis sequences,
   wherein reordering the first group of encoded bits and the second group of encoded bits comprises:
      swapping the positions of bit b(11) and bit b(2) by swapping a third bit in the first group of encoded bits with a second bit in the second group of encoded bits;

swapping the positions of bit b(12) and bit b(3) by swapping a fourth bit in the first group of encoded bits with a third bit in the second group of encoded bits;

swapping the positions of bit b(14) and bit b(4) by swapping a fifth bit in the first group of encoded bits with a fifth bit in the second group of encoded bits;

swapping the positions of bit b(17) and bit b(7) by swapping an eighth bit in the first group of encoded bits with an eighth bit in the second group of encoded bits; and swapping the positions of bit b(19) and bit b(9) by swapping a tenth bit in the first group of encoded bits with a tenth bit in the second group of encoded bits.

2. The method of claim 1, wherein each of the plurality of basis sequences comprises a twenty-bit sequence that includes at least one non-zero value in the first ten bits and at least one non-zero value in the second ten bits.

3. The method of claim 2, wherein the basis sequences comprise the bit sequences:

[1 1 1 1 1 1 1 1 1 1 1 1 1 1 1 1 1 1 1 1];
[1 1 0 0 1 1 0 0 1 0 0 1 0 1 0 1 1 0 1 0];
[0 1 0 1 1 0 1 0 0 1 1 1 0 0 0 0 1 0 0 0];
[0 0 1 1 1 0 0 1 1 1 0 0 1 1 0 0 0 1 1 0];
[0 0 0 0 0 1 1 1 1 1 0 0 0 0 1 1 1 1 1 0];
[0 0 1 0 0 1 1 0 0 1 1 1 0 0 0 1 1 0 1 1];
[0 0 0 0 1 1 0 1 1 0 1 0 1 1 1 1 0 0 1 0];
[0 0 1 1 0 1 1 1 0 0 0 1 1 0 0 0 0 1 0 0];
[0 1 1 0 0 0 1 0 1 1 1 0 1 1 0 1 1 0 0 0];
[1 1 1 1 1 1 1 1 1 1 1 1 1 1 1 1 0 0 0 0];
[1 1 1 1 1 1 1 1 1 1 1 1 1 1 1 0 0 1 0 0]; and
[0 0 1 1 1 1 1 1 1 1 1 1 1 1 1 1 1 1 0 0].

4. The method of claim 1, wherein decoding the control codeword using a plurality of basis sequences comprises:
accessing a set of basis sequences;
determining a subset of the set that includes only those basis sequences in the set having at least one non-zero value in their first ten bits and at least one non-zero value in their second ten bits; and
decoding the control codeword using the subset of basis sequences.

5. A communication apparatus for decoding a received control codeword that comprises encoded bits b(0), b(1), . . . , b(19), the apparatus comprising:

a receiver operable to:
receive, on a first set of carriers, a first group of the encoded bits in the control codeword, wherein the first group includes bits {b(0), b(1), b(5), b(6), b(8), b(11), b(12), b(14), b(17), b(19)} of the control codeword;

receive, on a second set of carriers, a second group of the encoded bits in the control codeword, wherein the second group includes the encoded bits {b(2), b(3), b(4), b(7), b(9), b(10), b(13), b(15), b(16), b(18)} of the control codeword and wherein the second set of carriers have different frequencies from the first set of carriers;

a processor operable to:
reconstruct the control codeword from the first group of encoded bits and the second group of encoded bits by:
reordering the first group of encoded bits and the second group of encoded bits; and
combining the first group of encoded bits and the second group of encoded bits; and
decoding the control codeword using a plurality of basis sequences, wherein the processor is operable to reorder the first group of encoded bits and the second group of encoded bits by:

swapping the positions of bit b(11) and bit b(2) by swapping a third bit in the first group of encoded bits with a second bit in the second group of encoded bits;

swapping the positions of bit b(12) and bit b(3) by swapping a fourth bit in the first group of encoded bits with a third bit in the second group of encoded bits;

swapping the positions of bit b(14) and bit b(4) by swapping a fifth bit in the first group of encoded bits with a fifth bit in the second group of encoded bits;

swapping the positions of bit b(17) and bit b(7) by swapping an eighth bit in the first group of encoded bits with an eighth bit in the second group of encoded bits; and swapping the positions of bit b(19) and bit b(9) by swapping a tenth bit in the first group of encoded bits with a tenth bit in the second group of encoded bits.

6. The apparatus of claim 5, wherein each of the plurality of basis sequences comprises a twenty-bit sequence that includes at least one non-zero value in the first ten bits and at least one non-zero value in the second ten bits.

7. The apparatus of claim 6, wherein the basis sequences comprise the bit sequences:

[1 1 1 1 1 1 1 1 1 1 1 1 1 1 1 1 1 1 1 1];
[1 1 0 0 1 1 0 0 1 0 0 1 0 1 0 1 1 0 1 0];
[0 1 0 1 1 0 1 0 0 1 1 1 0 0 0 0 1 0 0 0];
[0 0 1 1 1 0 0 1 1 1 0 0 1 1 0 0 0 1 1 0];
[0 0 0 0 0 1 1 1 1 1 0 0 0 0 1 1 1 1 1 0];
[0 0 1 0 0 1 1 0 0 1 1 1 0 0 0 1 1 0 1 1];
[0 0 0 0 1 1 0 1 1 0 1 0 1 1 1 1 0 0 1 0];
[0 0 1 1 0 1 1 1 0 0 0 1 1 0 0 0 0 1 0 0];
[0 1 1 0 0 0 1 0 1 1 1 0 1 1 0 1 1 0 0 0];
[1 1 1 1 1 1 1 1 1 1 1 1 1 1 1 1 0 0 0 0];
[1 1 1 1 1 1 1 1 1 1 1 1 1 1 1 0 0 1 0 0]; and
[0 0 1 1 1 1 1 1 1 1 1 1 1 1 1 1 1 1 0 0].

8. The apparatus of claim 5, wherein the processor is operable to decode the control codeword using a plurality of basis sequences by:
accessing a set of basis sequences;
determining a subset of the set that includes only those basis sequences in the set having at least one non-zero value in their first ten bits and at least one non-zero value in their second ten bits; and
decoding the control codeword using the subset of basis sequences.

* * * * *

UNITED STATES PATENT AND TRADEMARK OFFICE
CERTIFICATE OF CORRECTION

PATENT NO. : 8,605,669 B2
APPLICATION NO. : 13/101752
DATED : December 10, 2013
INVENTOR(S) : Cheng et al.

It is certified that error appears in the above-identified patent and that said Letters Patent is hereby corrected as shown below:

In the Specification

In Column 3, Line 6, delete "interleaver:" and insert -- interleaver; --, therefor.

In Column 3, Line 56, delete "hit-swapping" and insert -- bit-swapping --, therefor.

In Column 9, Line 38, delete "interleavers" and insert -- interleavers. --, therefor.

In Column 9, Line 54, delete "Interleaver A A" and insert -- Interleaver A - A --, therefor.

In Column 11, Line 30, delete "b(19)" and insert -- b(19). --, therefor.

In Column 12, Line 15, delete "b(18)" and insert -- b(18). --, therefor.

In Column 13, Line 30, delete "b(19)" and insert -- b(19). --, therefor.

In Column 20, Line 56, delete "a analogous" and insert -- an analogous --, therefor.

In Column 21, Line 18, delete "assignment or" and insert -- assignment of --, therefor.

In Column 23, Line 64, delete "hits" and insert -- bits --, therefor.

Signed and Sealed this
Twenty-ninth Day of July, 2014

Michelle K. Lee
*Deputy Director of the United States Patent and Trademark Office*